(12) United States Patent
Dubin

(10) Patent No.: US 9,105,628 B1
(45) Date of Patent: Aug. 11, 2015

(54) THROUGH SUBSTRATE VIA (TSUV) STRUCTURES AND METHOD OF MAKING THE SAME

(76) Inventor: Valery Dubin, Portland, OR (US)

(*) Notice: Subject to any disclaimer, the term of this patent is extended or adjusted under 35 U.S.C. 154(b) by 130 days.

(21) Appl. No.: 13/434,688

(22) Filed: Mar. 29, 2012

(51) Int. Cl.
*H01L 23/498* (2006.01)
*H01L 21/48* (2006.01)
*H01L 21/768* (2006.01)
*H01L 23/538* (2006.01)

(52) U.S. Cl.
CPC ........ *H01L 23/49827* (2013.01); *H01L 21/486* (2013.01); *H01L 21/76831* (2013.01); *H01L 21/76879* (2013.01); *H01L 23/5384* (2013.01); *H01L 2224/02372* (2013.01); *H01L 2224/05009* (2013.01); *H01L 2224/05025* (2013.01); *H01L 2224/0557* (2013.01); *H01L 2224/08146* (2013.01); *H01L 2224/08165* (2013.01); *H01L 2224/08235* (2013.01); *H01L 2224/13009* (2013.01); *H01L 2224/13025* (2013.01); *H01L 2224/16146* (2013.01); *H01L 2225/06541* (2013.01); *H01L 2225/06544* (2013.01); *H01L 2225/06548* (2013.01)

(58) Field of Classification Search
CPC ............ H01L 21/486; H01L 21/76831; H01L 21/76879; H01L 23/49827; H01L 23/5384; H01L 2224/02372; H01L 2224/05009; H01L 2224/05025; H01L 2224/0557; H01L 2224/08146; H01L 2224/08165; H01L 2224/08235; H01L 2224/13009; H01L 2224/13025; H01L 2224/16146; H01L 2225/06541; H01L 2225/06544; H01L 2225/06548
USPC ................. 257/686, 723, 737, 774, 777, 778, 257/E23.011, E23.142, E23.145, E23.169, 257/E23.174, 738; 438/107, 109, 110, 613, 438/629, 637–640, 667, 668, 672, 675
See application file for complete search history.

(56) References Cited

U.S. PATENT DOCUMENTS

| 3,843,363 | A | * | 10/1974 | Lehman | ........................ 430/413 |
| 5,674,787 | A | | 10/1997 | Zhao et al. | |
| 5,695,810 | A | | 12/1997 | Dubin et al. | |
| 5,712,080 | A | | 1/1998 | Satsu et al. | |
| 6,332,903 | B1 | | 12/2001 | Otani | |
| 6,448,153 | B2 | | 9/2002 | Siniaguine et al. | |
| 6,693,361 | B1 | | 2/2004 | Siniaguine et al. | |
| 6,897,148 | B2 | * | 5/2005 | Halahan et al. | ............... 438/678 |

(Continued)

OTHER PUBLICATIONS

"Selective and Blanket Electroless Copper Deposition for Ultralarge Scale Integration" by Dubin et al., J. Electrochem. Soc., vol. 144, No. 3, Mar. 1997, 11 pages.

"3D System Integration Technologies" by Ramm et al., Mat. Res. Soc. Symp. Proc. vol. 766 © 2003 Materials Research Society, 12 pages.

*Primary Examiner* — Fernando L Toledo
*Assistant Examiner* — Christine C Lau
(74) *Attorney, Agent, or Firm* — Blakely Sokoloff Taylor Zafman, LLP

(57) ABSTRACT

Through substrate via (TSuV) structures and method of making the same are disclosed herein. In embodiments, TSuV structures are metal filled selectively to avoid forming significant metal overburden on non-via surfaces of the substrate. In certain embodiments, post-fill metal removal/planarization operations are eliminated for reduced process complexity and manufacturing cost. In embodiments, selective metal fill entails selective electroless or electrolytic deposition. Both front side and back side selective deposition methods are described along with features of through substrate via structures made with such methods.

15 Claims, 18 Drawing Sheets

(56) References Cited

U.S. PATENT DOCUMENTS

| | | | |
|---|---|---|---|
| 7,060,601 | B2 | 6/2006 | Savastiouk et al. |
| 7,186,586 | B2 | 3/2007 | Savastiouk et al. |
| 7,355,273 | B2 | 4/2008 | Jackson et al. |
| 7,564,115 | B2 | 7/2009 | Chen et al. |
| 7,576,435 | B2 | 8/2009 | Chao |
| 7,683,478 | B2 | 3/2010 | Chen et al. |
| 7,691,748 | B2 | 4/2010 | Han |
| 7,741,148 | B1 | 6/2010 | Marimuthu et al. |
| 7,741,218 | B2 * | 6/2010 | Sparks et al. ............ 438/669 |
| 7,843,064 | B2 | 11/2010 | Kuo et al. |
| 7,919,859 | B2 | 4/2011 | Zhong et al. |
| 2005/0133930 | A1 * | 6/2005 | Savastisuk et al. ........... 257/774 |
| 2006/0046471 | A1 * | 3/2006 | Kirby et al. ................ 438/638 |
| 2009/0224405 | A1 * | 9/2009 | Chiou et al. ................ 257/758 |
| 2010/0126872 | A1 * | 5/2010 | Paneccasio et al. ........... 205/123 |
| 2011/0291268 | A1 * | 12/2011 | Wang et al. ................. 257/737 |

OTHER PUBLICATIONS

"3D Stacked Flip Chip Packaging with Through Silicon Vias and Copper Plating or Conductive Adhesive Filling" by Lee et al., 2005 Electronic Components and Technology Conference, 7 pages.

"Through Silicon Via Technology—Processes and Reliability for Wafer-Level 3D System Integration" by Ramm et al., 2008 Electronic Components and Technology Conference, 6 pages.

"System-in-package integration of passives using 3D through-silicon vias" by Roozeboom, et al., Solid State Technology, May 2008, 5 pages.

"Three dimensional silicon integration" by Knickerbocker et al., IBM J. Res. & Dev. vol. 52 No. 6 Nov. 2008, 17 pages.

"Wafer-level three-dimensional integrated circuits (3D IC): Schemes and key technologies" by Lai et al., Microelectronic Engineering, Jul. 26, 2011, 5 pages.

Polk et al.,"Tera-Scale Computing", Intel Technology Journal, vol. 11 Issue 03 Published, Aug. 22, 2007, ISSN 1535-864X, 99 pages.

* cited by examiner

US 9,105,628 B1

THROUGH SUBSTRATE VIA (TSUV) STRUCTURES AND METHOD OF MAKING THE SAME

TECHNICAL FIELD

Embodiments of the present invention relate to micro (nano) integrated circuit (IC) structures, and more particularly relate to through substrate via (TSuV) structures and methods of making TSuV structures and assemblies using such structures.

BACKGROUND

TSuV structures are a key enabling technology for higher density electronic devices. Many packaging strategies currently under development seek to reduce the form factor of a packaged ICs. TSuV structures offer a means to meet increasing IC I/O requirements as footprint (area) of the chip continues to scale down. 3DIC initiatives further seek to stack multiple IC chips in piggy-back fashion to increase computing and/or storage density for a given package footprint. Such multi-chip integration schemes typically entail at least one TSuV to vertically interconnect the individual IC chips.

Presently however, fabrication cost and reliability of TSuV structures pose a problem for industry. Techniques and the associated structures for a conventional "via-last" TSuV process are illustrated in FIGS. 1A and 1B. As shown in FIG. 1A, an IC includes a substrate 100 upon which is formed circuit devices, such as transistors, capacitors, photodetectors, LEDs, lasers, and the like. The circuit devices are then interconnected through multiple levels of metal and interlayer dielectric, referred to herein collectively as the back end of line (BEOL) stack 120. A metallized pad 150 serves as an electrical interface between the IC and the external world. A via 135 is formed through the BEOL stack 120 and into a significant portion of the substrate 100. The via 135 is then lined with an electrical isolation layer 138 consisting of a suitably resistive dielectric. Upon the isolation layer 138 is a barrier layer 142, typically of a refractory material, such as titanium nitride (TiN), tantalum (Ta), or tantalum nitride (TaN). The barrier layer serves, in one aspect, to inhibit the diffusion of the interconnection material (i.e., fill metal) that will subsequently be introduced in the via 135. Next, a suitable seed material 144 is deposited on the inner sidewall of the via 135 and on surfaces adjacent to the via 135. Suitable seed materials for the deposition of copper fill metal include copper (Cu), nickel (Ni), and cobalt (Co). A resist mask 130 is formed to leave only desired regions of the seed material 144 exposed.

Next, as shown in FIG. 1B, the fill metal 152, such as copper, is deposited, for example by electroplating, in a sufficient amount to fill the via 135. As shown, a significant amount of top side metal 151 is deposited over surfaces adjacent to the via 135 (i.e. non-via surfaces). Following fill of the via 135, the resist mask 130 is removed leaving the top side metal 151 to interconnect the pad 150 with the via 135. Typically, at least some portion of the top side metal 151 is considered overburden from the via fill process and necessitates removal, usually through chemical mechanical planarization (CMP). Finally, the substrate 100 is thinned to expose the bottom of the filled via 135, rendering a TSuV.

As illustrated, the conventional technique of forming a TSuV is generally based on the existing semiconductor processing techniques employed to form interconnects within the BEOL stack 120. While such reliance on existing techniques is understandable, inherent inefficiencies which may be tolerable in the context of BEOL processing are all the worse when applied to a TSuV. For example, with TSuVs being significantly larger and deeper than a BEOL via, problems with voiding and difficulties stemming from the amount of overburden 151 become all the more severe. CMP processing therefore becomes more complex and expensive with an attendant high consumables cost. A multiplicity of material layers, as well as poor step coverage of the isolation layer 138, the barrier 142, and/or the seed material 144 stemming from the aspect ratio (AR) and profile of the via 135 also limits scalability to >~5 μm (micron) and AR<~10. Finally, manufacturing yield is a more significant concern at the TSuV stage of processing, because each IC chip has a high value, having accumulated many hours of expensive processing time and thin film materials.

Therefore, TSuV structures with reduced defects (e.g., voids) and manufacturing techniques for such TSuV structures that reduce complexity are advantageous.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
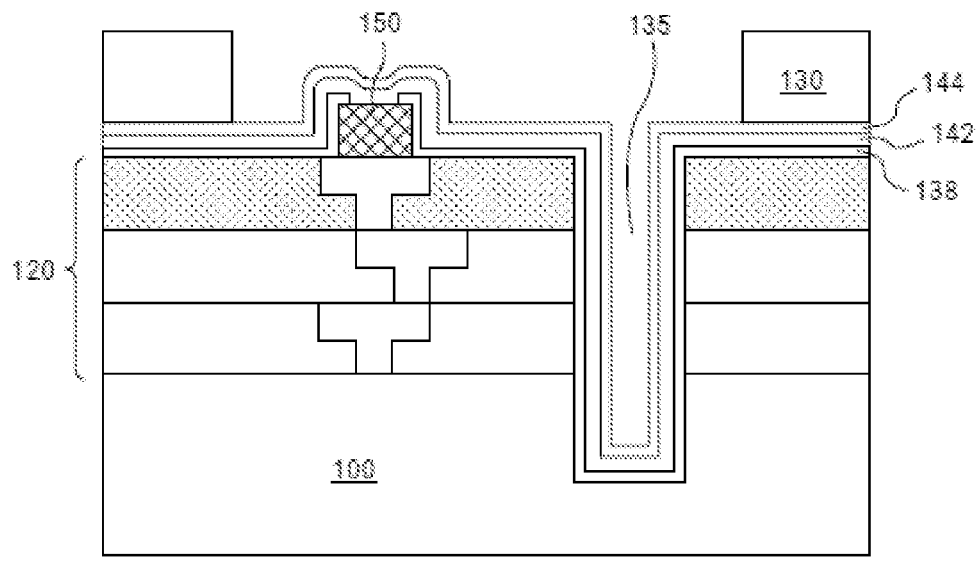
FIGS. 1A and 1B are cross-sectional illustrations of a conventional TSuV structure and fabrication technique.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Through substrate via (TSuV) structures and method of making the same are disclosed herein. In embodiments, TSuV structures are metallized selectively to avoid forming significant metal overburden on non-via surfaces of the substrate. In certain embodiments, post-fill metal removal/planarization operations are eliminated for reduced process complexity, reduced fixed cost (e.g., lower tool count) and reduced consumable cost. Both front side and back side selective deposition embodiments are described along with features of TSuV structures made with such methods. Both electrolytic and electroless deposition embodiments are described along with features of TSuV structures made with such techniques. In one or more of the embodiments, high AR (e.g., >30) and reduced via size (e.g., <1 μm) are achievable with copper-based fill metal.

In particular embodiments, TSuV structures entail a partially filled TSuV, having a fill metal filling only a portion of a longitudinal length of a through via so that a recess is present on at least one side of a substrate. In further embodiments, the recess on a first substrate is mated with a microbump present on a second substrate to achieve a 3D TSuV chip stack which may then be packaged as a unit.

Figure 2A:
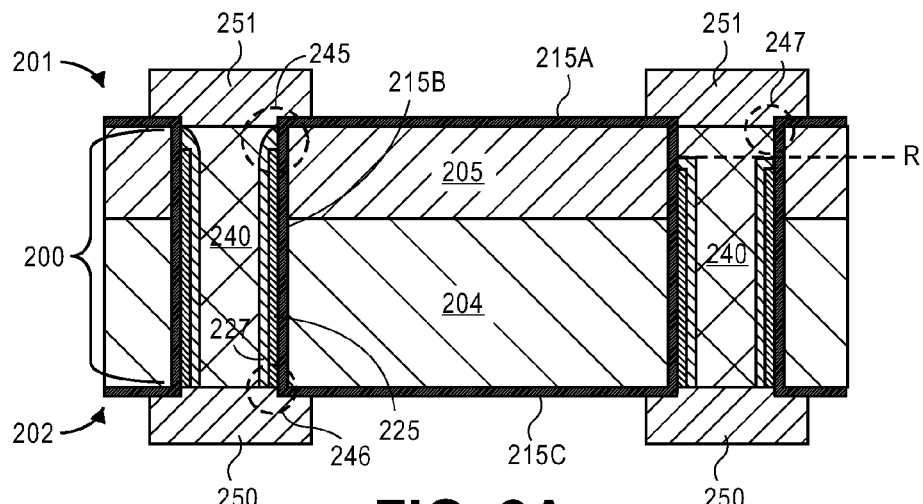
FIGS. 2A, 2B, and 2C are cross-sectional illustrations of TSuV structures, in accordance with exemplary embodiments.

Referring to FIG. 2A, a BEOL stack 205 is disposed on a substrate 204. Generally, the substrate 204 has been thinned, for example to 10-300 μm, and may be of any material conventional to the art of microelectronic device fabrication as the present embodiments are not limited in this respect. The substrate 204, may be, for example, bulk semiconductors or semiconductor-on-insulators (SOI) including semiconductor materials, such as, but not limited to single crystalline silicon (Si), germanium (Ge), III-V compounds (e.g., GaAs, InP, etc.), III-Nitride compounds (e.g., GaN), or the like. In alternate embodiments, the substrate is a dielectric material such as, but not limited to, bulk or thin film glass, sapphire, plastic, or the like. Similarly, embodiments of the present invention are not limited with respect to the BEOL stack 205. The BEOL stack 205 may entail one, or more, (e.g., 10-15 layers) of interconnect metallization and intervening interlayer dielectric materials (e.g., low-K materials). It is also noted embodiments described herein are not limited with respect to the type of microelectronic devices formed in or on one or more of the substrate 204 and BEOL stack 205. The microelectronic devices include one or more of electrical devices (e.g., transistors, memory cells, ASICs, and the like) electro-optical devices (photodetectors, modulators, lasers, LEDs, and the like), or microelectromechanical systems (MEMS), such as accelerometers, gyros, etc.

As illustrated in FIG. 2A, a microbump 251 is disposed on a "front" side surface 201, with an isolation layer 215A covering the BEOL stack 205 in regions where there is no microbump. The isolation layer 215A may be any of a number of dielectric materials known in the art to suit a function of electrical isolation and/or hermeticity. A microbump 250 is similarly disposed on a "back" side surface 202, with isolation layer 215C covering the substrate 204 in regions between a first and second microbump 250 as well as under microbump 250 except where via fill metal 240 is present. Generally, the microbumps 250, 251 may be of any composition known for bumping of chips, bumping of package substrates, etc. In particular embodiments, the microbumps 250, 251 are an alloy of tin-silver (SnAg), tin-silver-copper (SnAgCu), lead-tin (PbSn), or the like. The microbumps 250, 251 may further include under bump metallization (UBM) at the interface between of the TSuV 200. Exemplary UBM include at least one layer of: nickel (Ni), cobalt (Co), or iron (Fe) alloyed with at least one of: boron (B), phosphorous (P), nitrogen (N), tungsten (W), molybdenum (Mo), or rhenium (Re).

In embodiments, a TSuV structures includes a catalytic material 225 disposed on an inside sidewall surface of the TSuV 200. As described further elsewhere herein, the catalytic material 225 functions to activate the sidewall surfaces of the TSuV 200 for a subsequent metal deposition that is selective to the activated surfaces. In the exemplary embodiment, the catalytic material 225 is present along the full perimeter of the TSuV 200 at a given point along a length of the TSuV 200. In the exemplary embodiment illustrated by FIG. 2A, the catalytic material 225 extends a longitudinal length less than that of the TSuV 200. As further described elsewhere herein, this recessing of catalytic material 225 is a feature of a selective filling process employed to form the TSuV 200. For such embodiments, the catalytic material 225 is absent proximate to at least one end (proximate to top side 201 or bottom side 202) of the TSuV. As annotated in the region 245, the catalytic material 225 is minimally recessed from the front side 201 such that a thickness of a metal diffusion barrier 227 deposited selectively only the catalytic material 225 is nearly flush with the top side 201. As further illustrated in region 246, the catalytic material 225 is present proximate to the back side 202, not recessed and, for example, making contact with the microbump 250. As further described elsewhere herein, the presence of catalytic material 225 in the region 246 is a result of a front side via formation process whereby a non-through via is first filled selectively to regions of the front side 201 adjacent to the via (i.e., non-via or non-sidewall surfaces) and then a back side grind/polish is performed to open the bottom of the filled via as the TSuV 200.

The amount by which the at least one end of the TSuV is devoid of catalytic material 225 varies with implementation, but there is minimally catalytic material 225 disposed on at least some portion along the longitudinal length of the sidewall of the TSuV 200, for example at the interface of the microbump 250 and/or at the interface of the isolation layer 215C on the bottom side 202. The amount by which the catalytic material 225 can be recessed at one end (e.g., from top side 201) depends, at least in part, on whether the metallization selectively deposited onto the catalytic material 225 has, or needs, diffusion barrier properties. For example, where the metallization selectively deposited onto the catalytic material 225 is required to provide a diffusion barrier, the recess of catalytic material 225 may be arbitrarily large only if the metal bulk filling the TSuV has adequate diffusion barrier properties in regions where the catalytic material 225 is absent. In other words, if the fill metal 240 has diffusion barrier properties, the catalytic material 225 need only to provide a seed location of minimal area for selective deposition of the fill metal 240 up the entire length of the TSuV 200. The same is true where the metallization selectively deposited onto the catalytic material 225 is not required to provide a diffusion barrier, for example where a dielectric liner, such as dielectric liner 215B, suffices as a diffusion barrier. In contrast, if there is to be a discrete barrier metal layer deposited onto the catalytic material 225, such as the barrier layer 227, the catalytic material 225 may only be recessed by an amount which will still permit the barrier layer 227 to adequately coat the TSuV 200. For example, as illustrated by region 245, the catalytic material 225 is recessed so as to not extend the full length of the TSuV 200, but still permit the barrier layer 227 to extend as much of the full length of the TSuV 200 as possible. For such embodiments, recess of the catalytic material 225 is to be well-controlled to sub-micron levels.

In some embodiments, diffusion barrier requirements may be different between the substrate 204 and the BEOL stack 205. For example, one or more structures built into the BEOL stack 205 (not depicted) may serve as a diffusion barrier surrounding the TSuV, alleviating the diffusion barrier requirements of the TSuV 200 along the portion of the TSuV 200 extending through the BEOL stack 205. For such embodiments, the catalytic material 225 may be recessed by an amount that results in the diffusion barrier layer 227 also not lining the entire length of the TSuV 200, as shown by the region 247 in FIG. 2A. As such, the catalytic material 225 may be recessed anywhere from greater than null to many microns.

Generally, the catalytic material 225 may include one or more constituents with each constituent being any of the number of materials known in the art to be either catalytically active, a matrix material carrying the catalytically active material, or a byproduct of forming the catalytic material 225 (e.g., trace contaminants, etc.). In the exemplary embodiment, the catalytic material 225 is a metal film (having a continuous morphology) or a plurality of metal particles (having discrete microstructures). The catalytic metal or metal particles may include, one or more of: palladium (Pd), silver (Ag), gold (Au), iridium (Jr), osmium (Os), platinum (Pt), rhodium (Rh), ruthenium (Ru), nickel (Ni), cobalt (Co), iron (Fe), tin (Sn), bismuth (Bi), cadmium (Cd), titanium (Ti), tantalum (Ta), vanadium (V), tungsten (W), aluminum (Al), or copper (Cu). In other embodiments, the catalytic material 225 is functionalized with functional groups such as, but not limited to, a self-assembled monolayer (SAM)-$NH_2Pd$.

In further embodiments, the catalytic material 225 is a photosensitive film including a chemical agent that either results in chemical dissolution of the catalytic material 225 or deactivates catalytically active species through a photochemical process upon exposure to light of a sufficient energy. In exemplary photosensitive film embodiments, one or more of: titanium oxide ($TiO_2$), tin oxide ($SnO_2$), zinc oxide (ZnO), and lead iodide ($PbI_2$) with catalytic particles intermix within the film. While generally, the catalytic particles may be any of those described above, in a preferred embodiment a photosensitive film including one or more of: titanium oxide ($TiO_2$), tin oxide ($SnO_2$), zinc oxide (ZnO), and lead iodide ($PbI_2$) further includes catalytic particles of one or more of: palladium (Pd), platinum (Pt), silver (Ag), gold (Au), nickel (Ni), cobalt (Co), or copper (Cu).

In embodiments, a TSuV structure includes a metal in direct contact with the catalytic material 225. In a first embodiment, as illustrated in FIG. 2A, the discrete diffusion barrier layer 227, separate from the fill metal 240, is in direct contact with the catalytic material 225. For embodiments employing a diffusion barrier layer 227, exemplary diffusion barrier layer materials include, but are not limited to, at least one of: nickel (Ni) or cobalt (Co) alloyed with at least one of: boron (B), phosphorus (P), nitrogen (N), tungsten (W), molybdenum (Mo), or rhenium (Re). In an alternate embodiment, the fill metal 240 is in direct contact with the catalytic material 225 (permitting a greater/less controlled recess of the catalytic material 225), e.g., where the fill metal 240 is of a material having adequate diffusion barrier properties, or where a diffusion barrier is present between the catalytic material 225 and the substrate 204 and/or the BEOL stack 205.

Depending on the selective deposition technique employed, the fill metal 240 may include one or more constituents, and either be of homogeneous composition and homogeneous microstructural morphology throughout at least along the transverse dimension (i.e., diameter) of the TSuV 200, or inhomogeneous (e.g., as a layered/laminate or otherwise of varied composition and/or microstructural morphology). The fill metal 240 may include one or more of: via metal comprises at least one of: copper (Cu), tin (Sn), indium (In), nickel (Ni), cobalt (Co), gold (Au), Ag (silver), palladium (Pd), tungsten (W), gallium (Ga), tin-silver (SnAg), tin-silver-copper (SnAgCu), indium-tin (InSn), nickel-palladium-gold (NiPdAu), or lead-tin (PbSn).

In one embodiment, for example where a selective electroless deposition is performed, the fill metal 240 is of a homogeneous composition and microstructure, is under compressive stress, includes copper (Cu) as the primary constituent, and further includes at least 1 PPM of at least one of: hydrogen (H), chlorine (Cl), oxygen (O), sulfur (S), carbon (C), or nitrogen (N). In alternate embodiments, for example where a selective electrolytic deposition is performed, the fill metal 240 is homogeneous in composition and microstructure, includes copper (Cu) as the primary constituent, and has less than 1 PPM of all of: hydrogen (H), chlorine (Cl), oxygen (O), sulfur (S), carbon (C), or nitrogen (N). For either embodiment, where the function of the diffusion barrier 227 is provided by the fill metal 240 (again, permitting a greater/less controlled recess of the catalytic material 225), the fill metal 240 may further include at least one alloy metal of: manganese (Mn), tungsten (W), or molybdenum (Mo), magnesium (Mg), rhenium (Re), zirconium (Zr), hafnium (Hf), niobium (Nb), vanadium (V), or titanium (Ti).

In embodiments, the fill metal 240, like the catalytic material 225, extends less than the full longitudinal length of the TSuV 200. In particular, the fill metal 240 may be recessed from the front side 201. As describe further elsewhere herein, a recessed fill metal 240 may facilitate assembly of the TSuV 200 with another substrate (e.g., a second chip substrate or a package substrate) whereby a microbump, post, or the like, is to take the place of the microbump 251 and have proper dimension to be received into the recess fill metal 240 within the TSuV 200. The fill metal 240 is generally recessed by an amount dependent on the amount of recess implemented for the catalytic material 225 as the deposition is selective to the catalytic material 225. For example, referring to FIG. 2A, the fill metal 240 may be distal from the front side 201 by a recess amount (R), approximately equal the catalytic material recess. Notably, with the selective metal deposition processes described herein, recessing of fill metal 240 to extend less than the length of the TSuV 200 can be readily achieved as deposition over regions adjacent to the TSuV 200 is avoided. In contrast, with conventional unselective depositions a partial fill would likely necessitate a selective etch of the fill metal.

In certain TSuV embodiments, a dielectric liner is provided. As illustrated in FIG. 2A for example, the dielectric liner 215B is disposed over the inside sidewall of the TSuV 200, separating the metal (e.g., fill metal 240, diffusion barrier 227, metals in catalytic material 225) from the substrate 204 and/or from the BEOL stack 205. In the exemplary embodiment shown, the catalytic material 225 is disposed on the surface of the dielectric liner 215B. Generally the dielectric liner 215B is to at least provide electrical isolation between the metals in the TSuV 200 and regions adjacent to the TSuV 200 (e.g., substrate 204). As such, the dielectric liner 215B may be organic or inorganic, and, for example, may be one or more layers of at least one of: silicon dioxide ($SiO_2$), aluminum oxide ($Al_2O_3$), tantalum oxide ($Ta_2O_5$), silicon nitride ($Si_xN_y$), silicon carbide (SiC), silicon oxy-carbo-nitride (SiOCN), a benzocyclobutene (BCB)-based polymer, or a (p-xylylene)-based polymer, such as Paralyene X. In advantageous embodiments, for example those where the dielectric liner 215B has a sufficient thickness of silicon nitride, silicon carbide, silicon oxy-carbo-nitride, or a (p-xylylene)-based polymer, the dielectric liner 215B may further function as a diffusion barrier, limiting diffusion of the fill metal 240 (e.g., Cu), moisture, oxygen, and the like. In certain such embodiments, the (metal) diffusion barrier 227 is absent, in reliance on the barrier properties of the dielectric liner 215B alone, thereby permitting a greater/less controlled recess of the catalytic material 225).

Figure 2B:
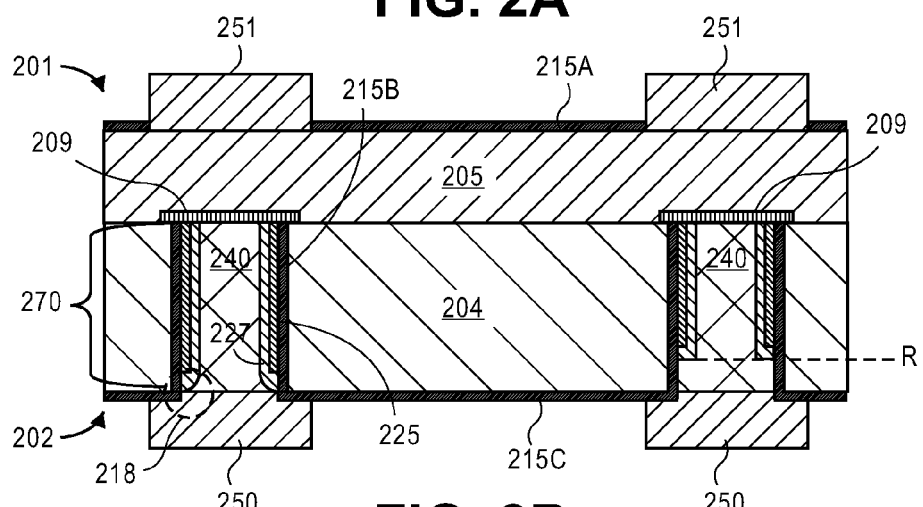

Referring now to FIG. 2B, in certain TSuV embodiments, a TSuV spans a longitudinal length through the substrate 204, but does not extend through a BEOL stack deposited on the substrate. For such an embodiment the TSuV is landed on a via etch stop layer having larger dimensions than that of the via (e.g., for alignment purposes). In the illustrative embodiment, the TSuV 270 stops at the interface between the BEOL stack 205 and the substrate 204 with a metallized front side pad 209 serving as a land for the via. The TSuV structure illustrated in FIG. 2B is associated with formation of a via from the back side 202; a method that is described in more detail elsewhere herein. Any and all of the materials described in the context of FIG. 2A may be utilized in the TSuV 270 in the same manner as described for the TSuV 200. In particular, each of the dielectric liner 215B, catalytic material 225, barrier layer 227, and fill metal 240 may be utilized as for the TSuV 270.

Notably, the dielectric liner 215B is present only on the via sidewalls and is absent from the front side pad 209, however the catalytic material 225 may also be disposed over the landing pad 209 (not illustrated). In embodiments, the front side pad 209 is either an electrode metal (e.g., a p or n contact metal, gate metal) or an interconnect metal employed within the BEOL stack 205. In preferred embodiments, the front side pad 209 is at the first interconnect metal level, or below (e.g., contact or gate metal) to permit routing over the TSuV 270 within the high interconnect levels of the BEOL stack 205. In other embodiments, stacked vias within the BEOL stack 205 may serve to electrically extend the TSuV 270 up through the BEOL stack 205. In that case, the front side landing pad 209 would be the first level of the stacked via structure.

In embodiments, at least one of the catalytic material 225, the fill metal 240, or a diffusion barrier 227 there between (if present) is recessed from an end of the TSuV 270 in a manner analogous to the TSuV 200. As shown in FIG. 2B for example, the catalytic material 225 is recessed from the substrate back side 202 in the region 218. In the context of the TSuV 270, this recess is a structural manifestation of the substrate 204 being thinned prior to via formation and via fill being performed selectively so as to not also deposit metal on the back side 202. The characteristics of the catalytic material recess described in the context of the front side 201 for the TSuV 200 are therefore all equally applicable to the TSuV 270.

In embodiments of the TSuV 270, the fill metal 240 extends less than the full longitudinal length of the TSuV 200. As shown in FIG. 2B for example, the fill metal 240 is recessed from the back side 202 by the recess (R). Here too, the recessed fill metal 240 may facilitate assembly of the TSuV 200 with another substrate (e.g., a second chip substrate or a package substrate) whereby a microbump, post, or the like, is to take the place of the microbump 250 and have proper dimension to be received into the recess fill metal 240 within the TSuV 200.

As with the TSuV 200, in particular embodiments of the TSuV 270 where the fill metal 240 is electrolessly deposited, the fill metal 240 is homogeneous in composition and microstructure, under compressive stress, and contains at least 1 PPM of at least one of: hydrogen (H), chlorine (Cl), oxygen (O), sulfur (S), carbon (C), or nitrogen (N). The fill metal 240 may be predominantly copper (Cu) and further alloyed at least one of: manganese (Mn), tungsten (W), or molybdenum (Mo), magnesium (Mg), rhenium (Re), zirconium (Zr), hafnium (Hf), niobium (Nb), vanadium (V), or titanium (Ti), as described for the TSuV 200. Electrolytic metal embodiments are also envisioned. In further embodiments of the TSuV 270, the dielectric liner 215 is at least one layer of at least one of: silicon dioxide ($SiO_2$), aluminum oxide ($Al_2O_3$), tantalum oxide ($Ta_2O_5$), silicon nitride ($Si_xN_y$), silicon carbide (SiC), silicon oxy-carbo-nitride (SiOCN), a benzocyclobutene (BCB)-based polymer, or a (p-xylylene)-based polymer. The dielectric liner 215 may also be of any of the other materials described in the context of the TSuV 200. The catalytic material 225 may advantageously include a photosensitive film comprising at least one of: titanium oxide ($TiO_2$), tin oxide ($SnO_2$), zinc oxide (ZnO), and lead iodide ($PbI_2$), with catalytic particles comprising at least one of: palladium (Pd), platinum (Pt), silver (Ag), gold (Au), nickel (Ni), cobalt (Co), or copper (Cu). The diffusion barrier 227, if present, may again include at least one of nickel (Ni) or cobalt (Co) alloyed with at least one of: boron (B), phosphorus (P), nitrogen (N), tungsten (W), molybdenum (Mo), or rhenium (Re), as described for the TSuV 200.

Figure 2C:
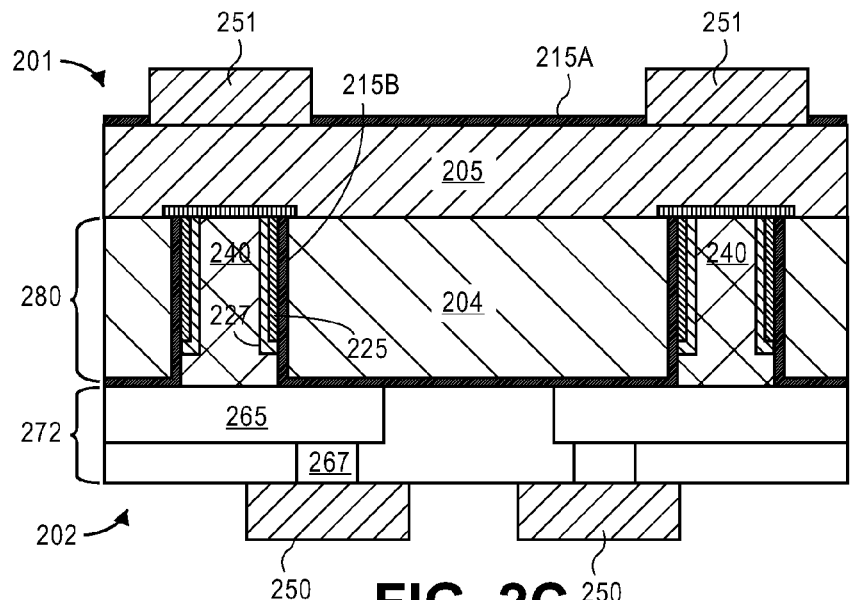

Referring now to FIG. 2C, certain TSuV embodiments may be buried below redistribution layers. Generally, the TSuV 280 has all the structural elements as the TSuV 270 with the microbump 250 separated from the substrate 204 by a back side redistribution layer 272 having at least one metal layer 265 electrically coupling the TSuV 280 to the microbump 250 (e.g., through second metal layer 267). Generally, the back side redistribution layer 272 may include any of the structures utilized for front side redistribution layers (i.e., fabricated as part of far back end processes like C4). For example, in addition to one or more metal routing layers, the back side redistribution layer 272 may further include a spin on dielectric such as BCB, polyimide (PI), or the like. Though not depicted, all embodiments described in the context of TSuV 200 (FIG. 2A) may also be similarly extended to include the back side redistribution layer 272.

Figure 3A:
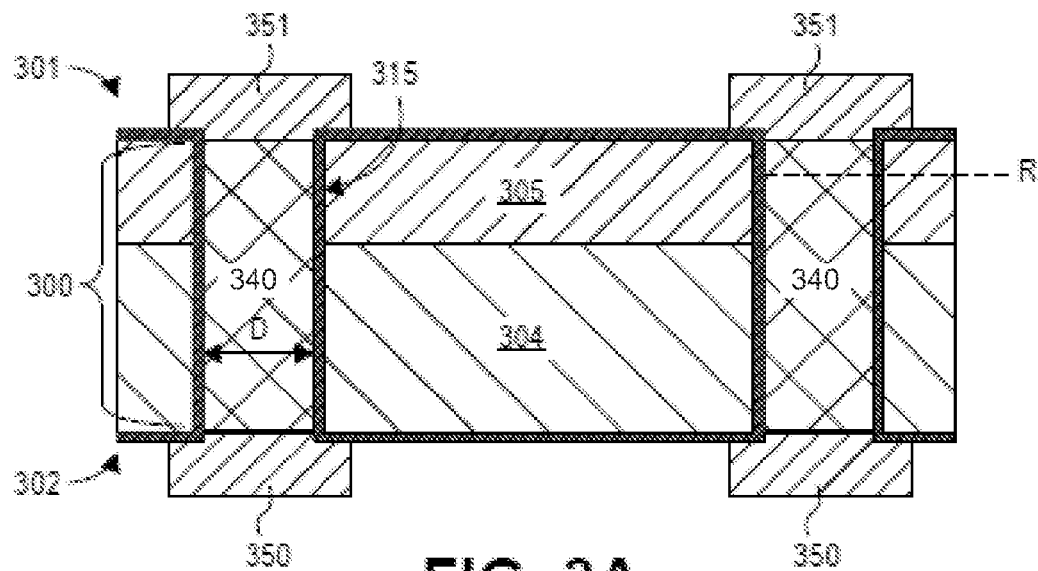
FIGS. 3A and 3B are cross-sectional illustrations of TSuV structures, in accordance with exemplary embodiments.
Figure 3B:
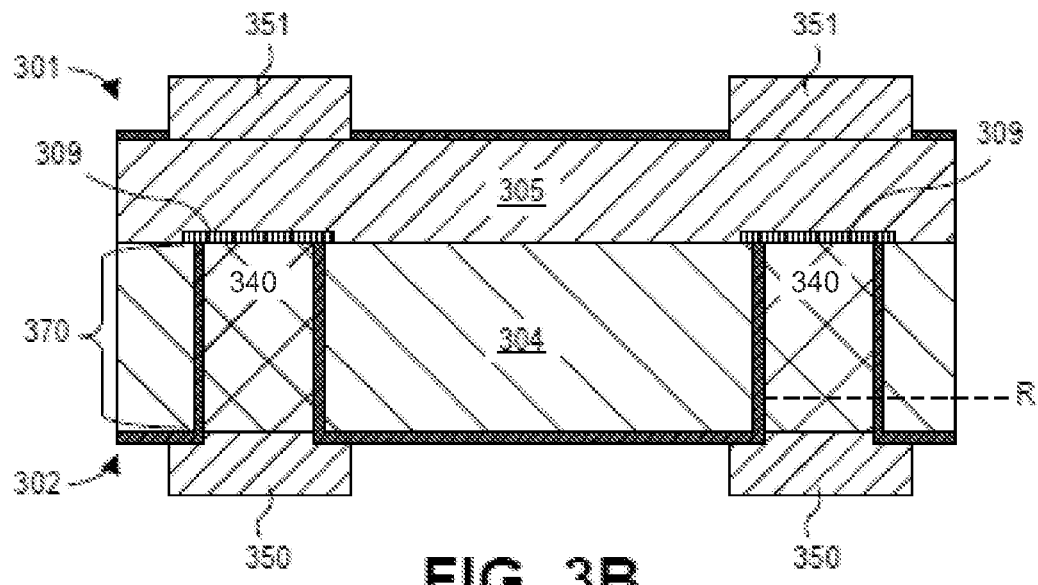

FIGS. 3A and 3B illustrate TSuV structures, in accordance with additional exemplary embodiments. The TSuV structures illustrated in FIGS. 3A, 3B have many structural features in common with the TSuV structures illustrated in FIGS. 2A, 2B, respectively. Generally, while selective deposition is still employed to form the TSuVs illustrated in FIGS. 3A, 3B, no catalytic material is present and instead deposition of the metal is selective to other structures. As such, metal within the TSuVs is in direct contact with the dielectric liner.

Referring first to FIG. 3A, the TSuV 300 extends entirely through the substrate 304. The substrate 304 may be any of those described elsewhere herein for substrate 204. In the illustrative embodiment, the TSuV 300 further extends entirely through the BEOL stack 305 (e.g., as might be useful for 3DIC chip stacking). The BEOL stack 305 may have any of the functional or structural attributes described elsewhere herein for BEOL stack 205. Disposed over a sidewall of the TSuV 300 is a dielectric liner 315. The dielectric liner 315 minimally serves at least the same electrical isolation function as described for dielectric liner 215. As such, all the dielectric materials described as suitable for dielectric liner 215 are also suitable for the dielectric liner 315. For example, the dielectric liner 315 may be any of silicon dioxide ($SiO_2$), aluminum oxide ($Al_2O_3$), tantalum oxide ($Ta_2O_5$), silicon nitride ($Si_xN_y$), silicon carbide (SiC), silicon oxy-carbo-nitride (SiOCN), a benzocyclobutene (BCB)-based polymer, or a (p-xylylene)-based polymer. In further embodiments where the dielectric liner 315 is further to serve a diffusion barrier function, the dielectric liner 315 may be any of those described as suitable for dielectric liner 215 in view of this additional functional constraint (e.g., at least one of silicon nitride, silicon carbide, silicon oxy-carbo-nitride, or a (p-xylylene)-based polymer).

In an embodiment, the via fill metal 340 making direct contact with the dielectric liner 315 has a homogeneous composition across the diameter (D) of the TSuV 300. In further embodiments, in addition to compositional homogeneity, the fill metal 340 is microstructurally homogeneous across the diameter (D) of the TSuV 300. The homogeneity is a physical manifestation of the selective TSuV filling process, which as described further elsewhere herein, is performed without a seed layer deposited on the sidewalls of the TSuV 300. As with the dielectric liner 315, the fill metal 340 may have any of the compositions described for the fill metal 240. In particular embodiments, for example where an electrolytic deposition process is employed, the primary constituent of the fill metal 340 is copper (Cu) with less than 1 PPM of any of: hydrogen (H), chlorine (Cl), oxygen (O), sulfur (S), carbon (C), or nitrogen (N). In other embodiments, for example where an electroless deposition process is employed, the fill metal 340 is under compressive stress, the primary constituent is copper (Cu), and there is at least 1 PPM of at least one of: hydrogen (H), chlorine (Cl), oxygen (O), sulfur (S), carbon (C), or nitrogen (N). In either of these embodiments, the fill metal 340 may consist essentially of copper (Cu) where "consists essentially of" is to allow inclusion of trace amounts of other atomic species, as long as such inclusion does not impart significant diffusion barrier properties or the fill metal 340 further includes at least one alloy metal selected from the group consisting of: manganese (Mn), tungsten (W), or molybdenum (Mo), magnesium (Mg), rhenium (Re), zirconium (Zr), hafnium (Hf), niobium (Nb), vanadium (V), or titanium (Ti). As described elsewhere herein, such alloying provides a Cu-based fill metal with diffusion barrier properties (i.e., a self-formed barrier).

As with the TSuV 200, the fill metal 340 in the TSuV 300 may be recessed (i.e., having a longitudinal length less than that of the TSuV 300). FIG. 3A illustrates with a dashed line a recess depth (R) from the front side 301 as an example where a microbump, etc. is to be received within the recess in place of the microbump 351.

Referring now to FIG. 3B, the TSuV 370 is generally the structural combination of the TSuV 270 (FIG. 2B) and the TSuV 300. As such, the TSuV 370 has a homogeneous fill metal 340 in direct contact with the dielectric liner. With the substrate 304 having microbumps on both the front side 301 and a back side 302 (351, 350, respectively and having any of the compositions described for microbumps 251 and 250), the TSuV 370 extends from the front side metal pad 309 disposed over a front side of the substrate 304. In the illustrative embodiment, the BEOL stack 305 provides at least one dielectric layer disposed between the front side bump and the front side metal pad, and wherein the TSuV extends between the front side metal pad and the back side bump. However, as noted for the TSuV 270, where the BEOL stack 305 includes a stacked-via structure, the TSuV 370 may be electrically extended all the way through the BEOL stack 305 in a manner functional equivalent to TSuV 300.

As with the TSuV 270, the fill metal 340 in the TSuV 370 may be recessed (i.e., having a longitudinal length less than that of the TSuV 370). FIG. 3B illustrates with a dashed line a recess depth (R) from the back side 302 as an example where a microbump, etc. is to be received within the recess in place of the microbump 350.

Figure 4A:
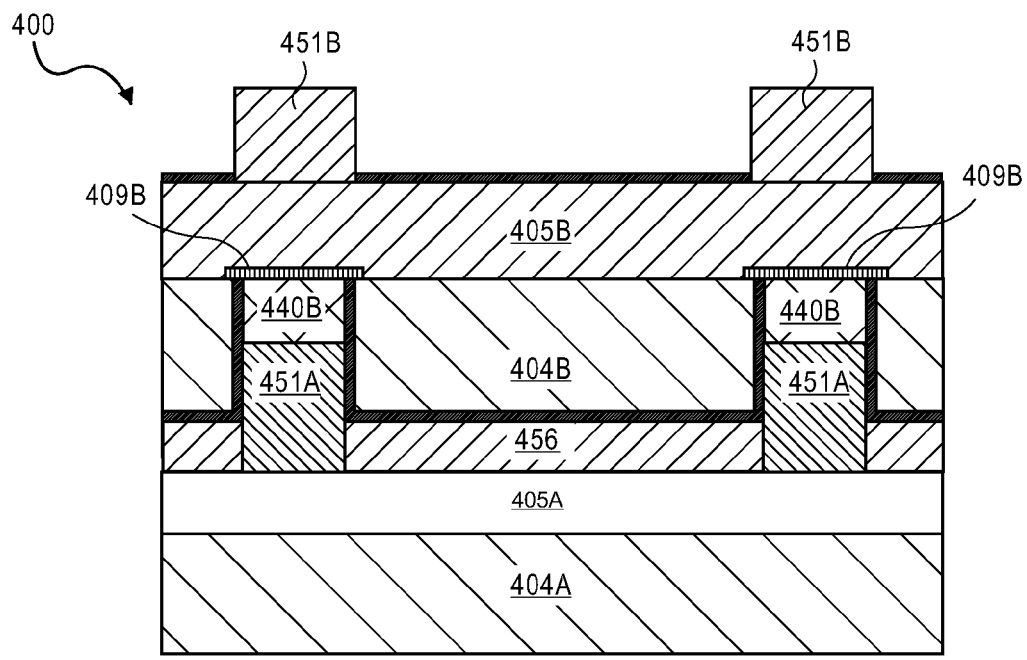
FIGS. 4A, 4B, and 4C are cross-sectional illustrations of stacked chips employing TSuV structures, in accordance with exemplary embodiments.
Figure 4B:
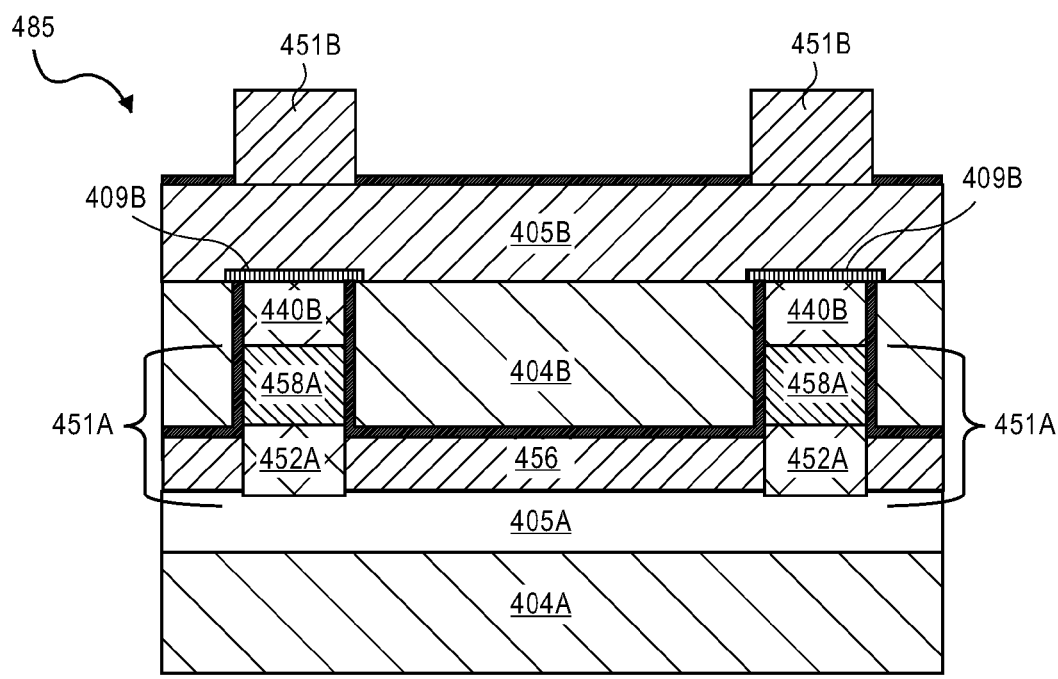
Figure 4C:
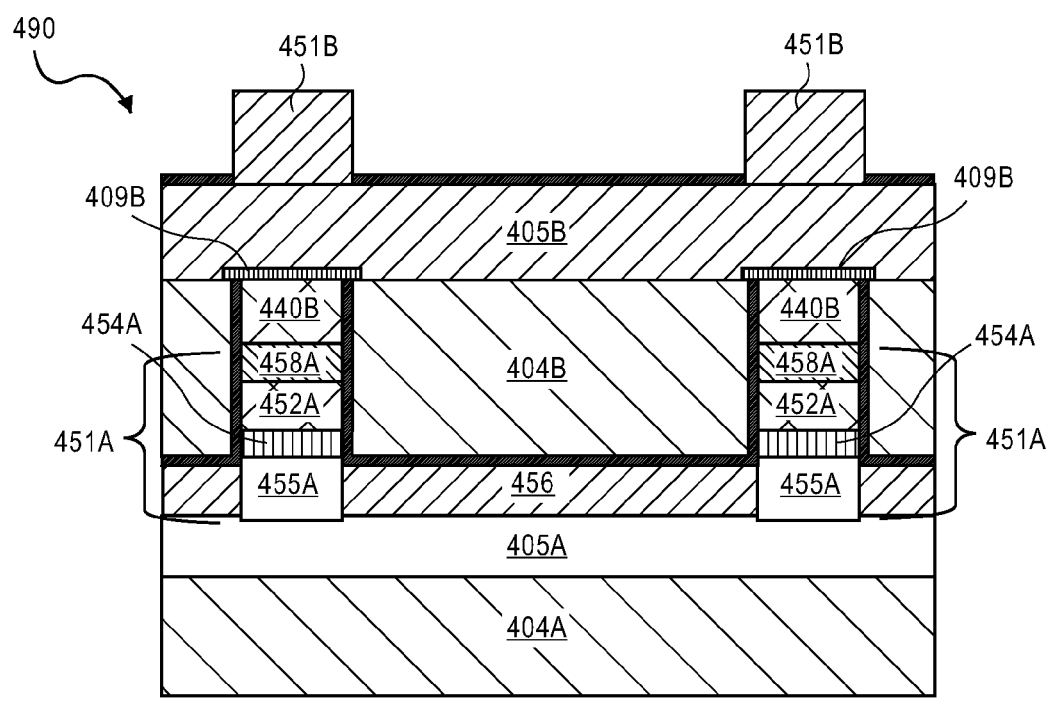

With TSuV structure embodiments described, assemblies of such structures, for example in the form of stacked TSuVs, are described in the context of the illustrative embodiments depicted in FIGS. 4A-4C. Generally, any of the TSuVs 200, 270, 280, 300, 370, and 380 may be assembled (i.e., stacked) together to include any number of substrates (i.e., 2, 3, . . . N substrates). In first embodiments, (micro)bumps of one substrate are bonded to the (micro)bumps of another substrate. For example, referring to FIGS. 2A, 2B, microbumps 250 or microbumps 251 from a first substrate may be bonded to either microbumps 250 or microbumps 251 of a second substrate.

In an alternative embodiment, a plurality of substrates are assembled with bump-to-TSuV bonding whereby a microbump on a first substrate is bonded directly to a TSuV (e.g., to fill metal) of a second substrate. One salient distinction between bump-to-bump and bump-to-TSuV follows from the microbump and the TSuV being at least of unequal dimension, and potentially also of different composition. In one exemplary embodiment, the TSuV metal is copper (Cu), tin (Sn), indium (In), nickel (Ni), cobalt (Co), gold (Au), or alloys thereof, while the bump metal includes at least one of: tin-silver (SnAg), tin-silver-copper (SnAgCu), or lead-tin (PbSn).

FIG. 4A illustrates one particular bump-to-TSuV assembly embodiment where a TSuV that is partially filled with via metal recessed from a back side of the substrate and a metal bump disposed in the recess. As shown, the microelectronic device assembly 400 includes a first substrate 404A having bumps 451A, in this case extending from a top side proximate to a first BEOL stack 405A. For clarity, the illustrative embodiment the first substrate 404A does not include a TSuV, however in other embodiments the first substrate 404A does include at least one TSuV. A second substrate 404B has a TSuV structure substantially as described for the TSuV 370

(FIG. 3B), with a fill metal 440B only partially filling the TSuV. In the exemplary embodiment, the fill metal 440B is recessed from a back side of the substrate 404B. However, in other embodiments a similar recess may exist on the front side relative to the BEOL stack 405B.

In the assembly 400, the fill metal 440B is joined to a bump 451A. Such a joint may entail a third joining compound (e.g., solder), a direct bond (e.g., reflow of the fill metal 440B and/or bump metal 451B). The assembly 400 offers unprecedented vertical stacking density as a portion of the 30-100 μm height by which the microbumps 451A extend from the surface of the BEOL stack 405A is received into the TSuV in the second substrate 404B. One or more collapse control structures may be included in the assembly 400. In the exemplary embodiment, a thickness of build-up 456 on the backside of the second substrate 404B controls assembly collapse. While any control collapse structure known in the art (e.g., those employed in flip chip processing) may be employed, materials such as, but not limited to BCB, PI are exemplary embodiments. In further embodiments, any underfill conventional to the packaging arts may be employed in place of, or in supplement to, the build-up 456.

In embodiments of assemblies joining a bump to a via metal filling, or partially filling, the TSuV, at least one of the bump metal or via metal comprises at least two metal layers having distinct composition. For example, a TSuV assembly may include a distinct surface finish metal layer. For those embodiments where a discrete surface finish metal is present in the TSuV metal (e.g., as a top layer selectively deposited onto a fill metal), that surface finish metal is absent from the surfaces of the bump not directly contacting the TSuV (e.g., the bump periphery). In contrast, where a discrete surface finish metal is present on the bump, bump surfaces not contacting the TSuV include the same surface finish as is present at the joint with the TSuV metal.

FIG. 4B illustrates an exemplary assembly 485 where the bump 451A includes bump metal 452A and 458A. The bump metal 458A is joined to the via fill metal 440B. The bump metal 458A may be any suitable finish metal known to be compatible with a given composition of via fill metal 440B. Exemplary embodiments of the bump metal 458A include: copper (Cu), tin (Sn), indium (In), nickel (Ni), cobalt (Co), gold (Au), Ag (silver), palladium (Pd), tungsten (W), gallium (Ga), tin-silver (SnAg), tin-silver-copper (SnAgCu), indium-tin (InSn), nickel-palladium-gold (NiPdAu), or lead-tin (PbSn), where the bump metal 452A is other than that selected for bump metal 458A. As one specific example, bump metal 452A is copper (Cu), or an alloy thereof, while bump metal 458A is tin (Sn), or an alloy thereof. In alternative embodiments, the via metal 440B includes at least two metal layers with distinct composition, at least one of which comprises: copper (Cu), tin (Sn), indium (In), nickel (Ni), cobalt (Co), gold (Au), Ag (silver), palladium (Pd), tungsten (W), gallium (Ga), tin-silver (SnAg), tin-silver-copper (SnAgCu), indium-tin (InSn), nickel-palladium-gold (NiPdAu), or lead-tin (PbSn).

FIG. 4C further illustrates an exemplary assembly 490 in which the microbump 451A comprises a stack of bump metals including at least two bump metals, 452A and 458A, as previously described in the context of FIG. 4B, and further including bump metal 454A (e.g. nickel (Ni) joined to a pad 455A (e.g., aluminum (Al) or an alloy thereof) embedded within a dielectric layer, for example, an anodic $Al_2O_3$, obtained by anodic oxidation of a deposited Al layer at anodic voltage in the range of 20V to 250V in the a solution such as, but not limited to, sulfuric, phosphoric, oxalic or citric acids.

Beginning now with further description of methods to fabricate the various TSuV structures and assemblies illustrated in the FIGS. 2A-4C, FIG. 5 is a general method applicable to all embodiments described herein. Referring first to FIG. 5A, the method 501 begins with receipt of a substrate at operation 505. The substrates may be any of those described elsewhere herein. The method 501 proceeds in a manner dependent on whether a front side or back side TSuV process is employed. In a front side embodiment, the method 501 proceeds to operation 506A to form the via before proceeding to operations 507A and 508B where the via is selectively filled and the substrate thinned to expose the metal filled via as the TSuV. In a second embodiment, the method 501 proceeds to operation 508A where the substrate is thinned before proceeding to operation 506B where the vias is formed and subsequently filled at operation 507B. Noting a front side via may need to be formed through both BEOL stacks and substrate materials while a back side via may need only be formed through a substrate material (e.g., stopping on a front side landing pad), both the via formation operations 506A and 506B may generally proceed by any manner known in the art. For example, a lithography process may photodefine a masking layer and one or more substrate removal processes then form a plurality of blind vias according the masking layer. Substrate removal processes include, but are not limited to, deep reactive ion (DRIE) etching, laser ablation, laser assisted removal (i.e., columnar conversion), laser jet drilling, water jet drilling, etc. Although not limited in this respect, exemplary via depths are 10-600 μm, more particularly 30-50 μm in depth and 1-10 μm, more particularly 5-8 μm in diameter.

Figure 6A:
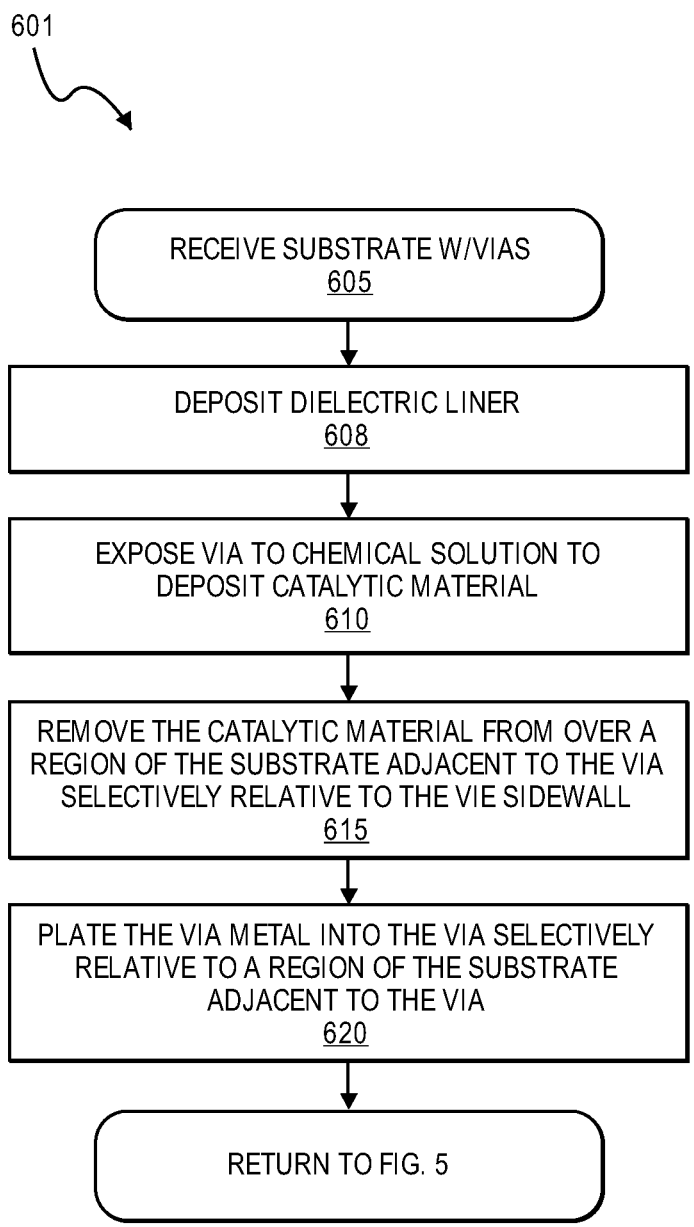
FIGS. 6A, 6B and 6C are flow diagrams illustrating methods of fabricating TSuV structures illustrated in FIGS. 2A, 2B, and 2C, in accordance with embodiments of FIG. 5.
Figure 6B:
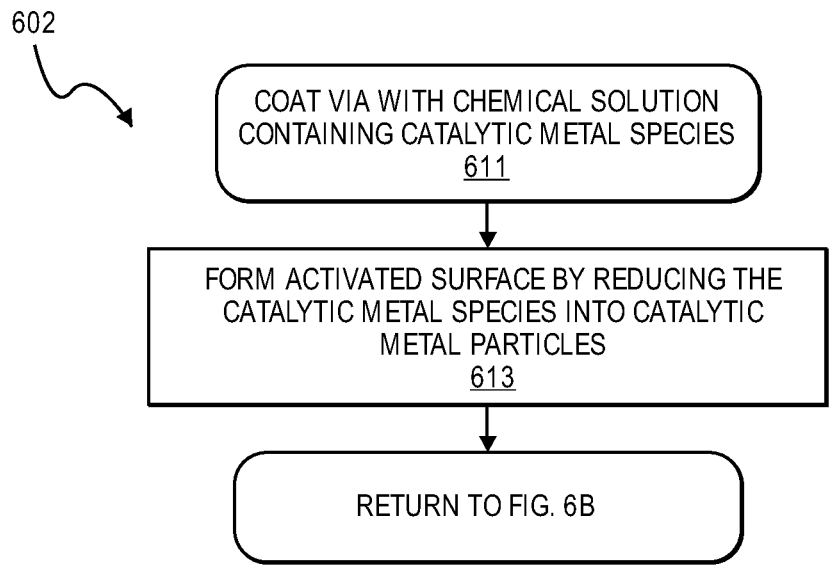
Figure 6C:
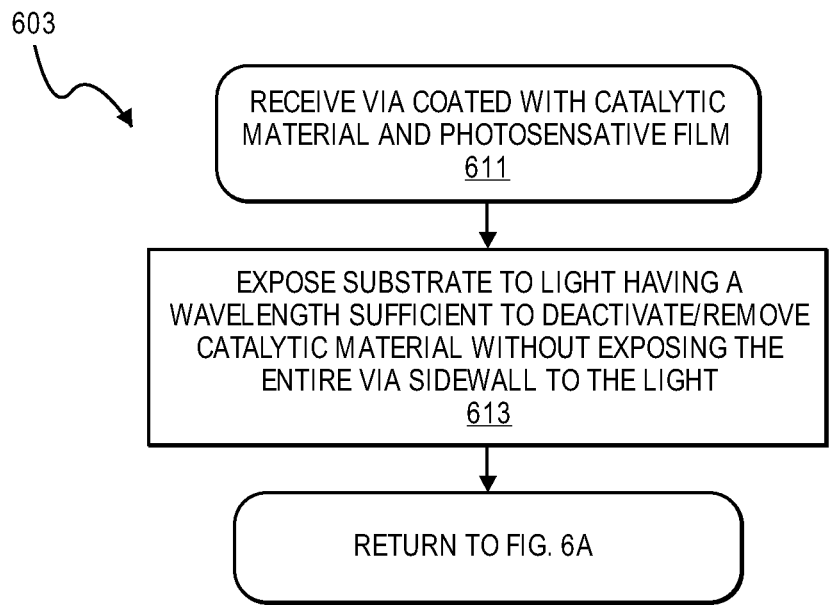

Selective fill of the vias at operations 507A and 507B generally entails a selective formation, via a selective deposition and/or a selective removal process, of at least one via metal (e.g., at least one of a catalytic material, barrier metal, or fill metal is selective to the via surfaces relative to non-via surfaces). The selective fill operations 507A and 507B are further described in the context of the flow diagrams in FIGS. 6A-6C and FIGS. 7A-7C, depending on the embodiment. FIGS. 6A-6C are flow diagrams illustrating methods of fabricating TSuV structures illustrated in FIGS. 2A-C, in accordance with embodiments. FIGS. 7A-7F are cross-sectional views of a TSuV at selected operations as the methods of fabricating TSuV structures illustrated in FIGS. 6A-6C are performed in accordance with an exemplary embodiment.

Method 601 begins at operation 605 with receipt of a substrate having vias. As shown in exemplary embodiment of FIGS. 7A and 7B, vias 710 are present in the front side 701 of the substrate 704, through the BEOL stack 705 and into a portion of the substrate thickness $T_1$.

Returning to FIG. 6A, the method 601 proceeds with deposition of a dielectric liner at operation 608. As further illustrated by FIG. 7C, a dielectric liner 715 is deposited to form at least a dielectric sidewall 716 along the entire longitudinal length 717, and may further form on the front side surface 701. A bottom surface of the via 710 may be covered with the dielectric liner 715, as depicted, though not necessary as the via bottom is eventually to be exposed. Generally, any spin-on, spray-on or other wet chemical applicant process know in the art as capable of depositing at least one of the dielectric liner materials described elsewhere may be performed at operation 608. In other embodiments, chemical vapor deposition (CVD), or plasma enhanced CVD (PECVD) is employed at operation 608. In certain embodiments, the dielectric liner deposition is a conformal process, achieving a conformality of at least 80% (minimum film thickness on topographic features such as sidewall is at least 80% of maximum film thickness on flat reference surfaces such as the front side 701). In further embodiments, deposition of the dielectric liner is a low temperature process, having a maximum substrate temperature during processing no greater than 250° C. For example, in one exemplary embodiment, a spin-coat or spray coat process is employed to deposit BCB a (p-xylylene)-based polymer, such as Paralyene X, or the like, at operation 608. In another exemplary embodiment, low-temperature CVD is employed to deposit silicon nitride, silicon carbide, silicon oxy-carbo-nitride.

Figure 7A:
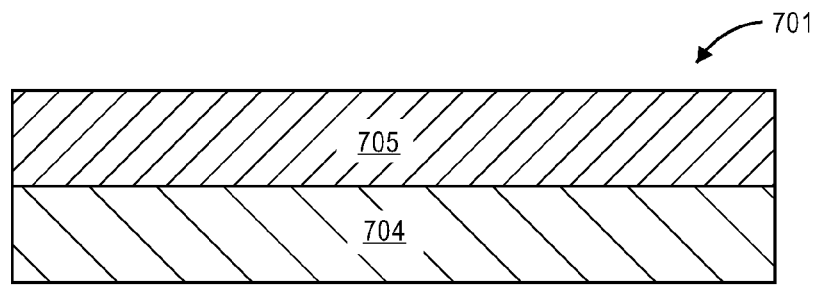
FIGS. 7A, 7B, 7C, 7D, 7E, 7F, 7G, 7H, 7I, 7J, and 7K are cross-sectional illustrations of a TSuV at selected operations as the methods of fabricating TSuV structures illustrated in FIGS. 6A, 6B and 6C are performed in accordance with an exemplary embodiment.
Figure 7B:
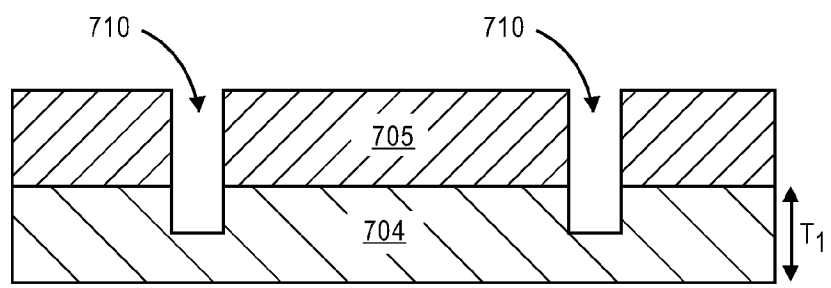
Figure 7C:
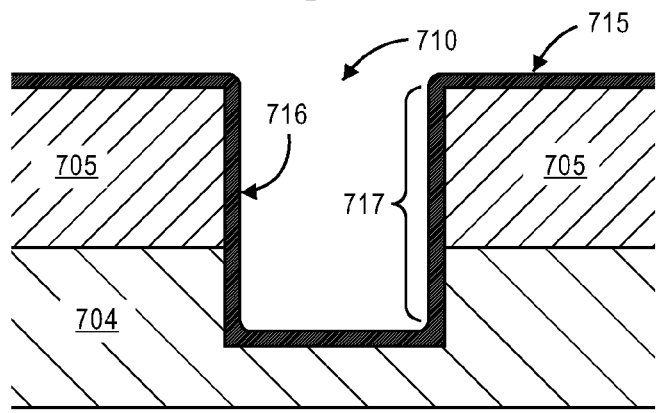
Figure 7D:
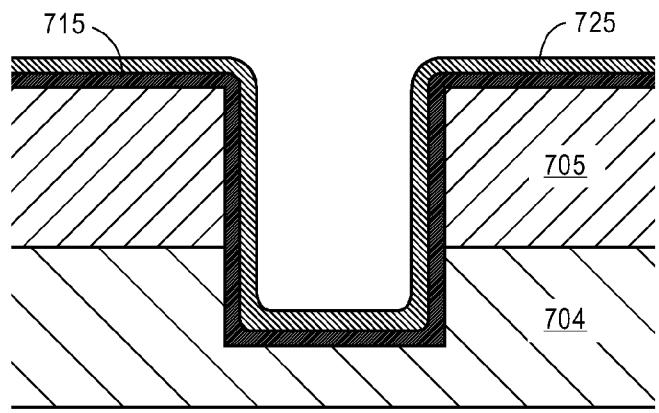
Figure 7E:
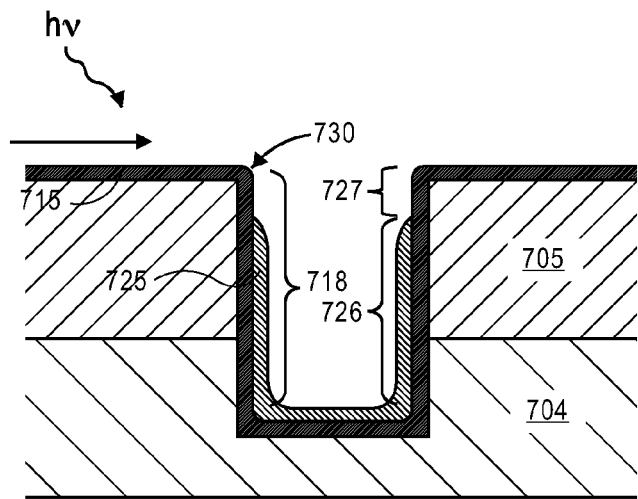

Method 601 (FIG. 6A) proceeds to operation 610 where catalytic material is deposited. Generally, with the goal of the method 601 being selective fill of the via, activation of the with a catalytic material is to selectively activate via surfaces only. As shown in FIG. 7D, the catalytic material 725 is deposited over the sidewall of the via, over the front side of the substrate 704, and in this embodiment, directly on the dielectric liner 715. While the operation 610 may entail any film deposition process whereby an activated surface is provided, FIG. 6B illustrates one exemplary embodiment. As shown, method 602 begins with exposing a via to a chemical activation solution (e.g. bath exposure, spin coat, spray coat, etc.) at operation 611. The chemical activation solution may be any known in the art for forming surfaces activated with one or more of catalytic materials described elsewhere herein. In the method 602 where the catalytic material is metal particles, the chemical activation solution has catalytic metal species that are reduced at operation 613 to form metal particles on at least the sidewalls of the via 710. For such an embodiment where the catalytic material 725 includes palladium (Pd) particles, a palladium activation solution includes a source of reducible palladium species, such as, but not limited to palladium chloride. The chemical activation solution may further include hydrochloric acid, acetic acid, and hydrofluoric acid or ammonium fluoride for contact displacement deposition and reducing agents such as, but not limited to borohydride, hypophosphite, dimethylamine borane (DMAB), hydrazine, and formaldehyde for electroless deposition. The method 602 then returns to method 601 (FIG. 6A).

In embodiments, the operation 610 includes forming one of the photosensitive film described elsewhere herein (e.g., titanium oxide ($TiO_2$), tin oxide ($SnO_2$), zinc oxide (ZnO), and lead iodide ($PbI_2$)). For such embodiments, the photosensitive film further includes catalytic particles the catalytic particles either on a top surface of the film or embedded throughout a thickness of the photosensitive film. In one embodiment, operation 610 entails, at least in part, exposing the via 710 to a chemical solution containing a photosensitive species. For example an amorphous $TiO_2$ layer including palladium may be formed by spin-coating on to a workpiece a solution containing a source of titanium ions and a solution containing a source of palladium ions. During a REDOX reaction, the oxidation state of the titanium ion may increase while the oxidation state of the palladium is reduced with the ion becoming a metal particle. Upon drying, a dried layer including the catalytic material within the photosensitive film is formed.

In embodiments, the operation 610 includes forming a polymer film with the catalytic material disposed on the surface and/or embedded through a thickness of the polymer film. For example, the via 710 may be exposed to a chemical solution containing a polymerizing agent which, upon drying, forms a dried layer including the catalytic material, a polymerizing species, and may also include a photosensitive species. In one such embodiment where the catalytic material 725 is SAM-$NH_2$Pd, a reduction of palladium ions in a polymerizing solution is achieved with a reducing agent, such as, but not limited to dimethylaminoborane (DMAB) or hypophosphite.

Following operation 610, the catalytic material deposited is removed from over a region of the substrate adjacent to the via at operation 615. The removal process is selective relative to the via sidewall such that the catalytic material is not removed from the entire longitudinal length of the via, but is however removed from substantially all no-via surfaces, such as over the front side 701. As further illustrated in FIG. 7E, the catalytic material 725 is removed from all surfaces except for a longitudinal via length 726. As such, over the front surface of the substrate 704, the dielectric liner 715 is exposed, as is a top corner of the via 730. The dielectric liner 715 extends a full via length 718 with the catalytic material 725 removed from the top via length 727.

Selective removal of the catalytic material 725 may be performed in a number of fashions so that no activation layer is formed on the flat (e.g., front side 701) of the substrate, depending on that material's composition. In embodiments, at least one chemical, mechanical, and photochemical technique is applied. As one example of selective chemical removal, a solvent of the catalytic material 725 may be applied in a manner that prevents wetting of the inner via surface. As one example of selective mechanical removal, an abrading force is applied through a directional jet of solution, flow of solution, etc. in a direction approaching parallel to the substrate front side surface 701 so that at least a portion of the inner via surfaces (i.e., sidewalls) are protected. As another example of selective mechanical removal, a pad (e.g., a CMP pad, a wet clean scrubbing, pad, etc.) is placed in direct contact with the catalytic material 725 disposed on the substrate front side surface 701 and motion of the pad removes mechanically (i.e., wipes off) the catalytic material 725 from the top surface selectively relative to inner via surfaces. Lift off processes during chemical etching of a sacrificial material such as, but not limited to, photoresist, BCB, titanium, and aluminum disposed on the front side surface 701 prior to deposition of the catalytic material 725 can be also used to subsequently remove the catalytic material 725 from the top surface selectively to the inner via surfaces.

FIG. 6C illustrates one exemplary photochemical removal method 603, where a via is received with catalytic material incorporated within a photosensitive film at operation 611. The substrate is exposed at operation 613 to light having an energy (hv) sufficient to remove or deactivate the catalytic material 725 without exposing the entire via sidewall to the light so as to retain a portion of the catalytic material 725 within the via 710. For example, where palladium ions are present in a photosensitive film containing $SnO_2$, photo oxidation of Sn(II) to Sn(IV) under UV light leads to deactivation of the reducing agent preventing reduction of Pd(II) ions to catalytic Pd particles on the light exposed front side surface 701 and therefore, the selective deactivation of the catalytic material 725. The method 603 then returns to the method 601 (FIG. 6A).

Figure 7F:
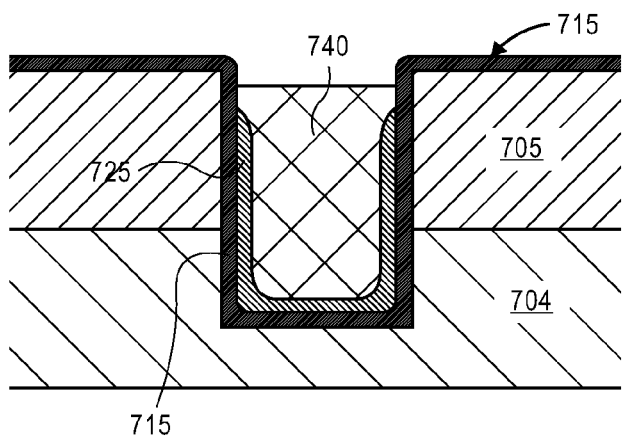

Proceeding with the method 601, at operation 620 via metal is plated into the via selectively relative to a region of the substrate adjacent to the via. As shown in FIG. 7F, the plating process occurs from the activated surfaces. In the exemplary embodiment, the plating process is an electroless process that deposits a fill metal 740 within the via 710. Electroless plating generally refers to chemically-induced oxidation-reduction reaction. Unlike an electroplating process, an electroless plating process requires no externally-supplied current. Instead, constituents of the plating process (e.g., constituents of a plating bath) initiate and maintain the plating process. One technique involves placing the workpiece in a bath containing one or more metal ions to be plated or introduced onto the activated surfaces (i.e., where the catalytic material 725 is present) along with one or more reducing agents to reduce the oxidation number of the metal ions. In general, any electroless deposition process known in the art may be employed for a process time appropriate to fill the via 710 to the desired level. Known suppressing agents may be employed to achieve superfill, or not for conformal plating. Noting electroless deposition rates are somewhat less than those of electrolytic processes (e.g., 0.1-0.2 μm/min), in advantageous embodiments, operation 620 is performed only to the extent to achieve partial filling (in terms of via depth, but within partial fill substantially voidless) of the via for use in interlocking bump-TSuV assemblies described elsewhere herein.

In embodiments, plating the fill metal at operation 620 entails electrolessly plating copper (Cu), or any of the copper-based alloy described elsewhere herein. In further embodiments, plating the via with metal at operation 620 comprises depositing a discrete metal diffusion barrier (not depicted in FIG. 7C) as a distinct step electrolessly plating at least one of: nickel (Ni) or cobalt (Co) alloyed with at least one of: boron (B), phosphorous (P), nitrogen (N), tungsten (W), molybdenum (Mo), or rhenium (Re). Such a diffusion barrier may fill the via 710 (e.g., as fill metal 740) or be a discrete plating operation forming a discrete diffusion barrier film.

Figure 1B:
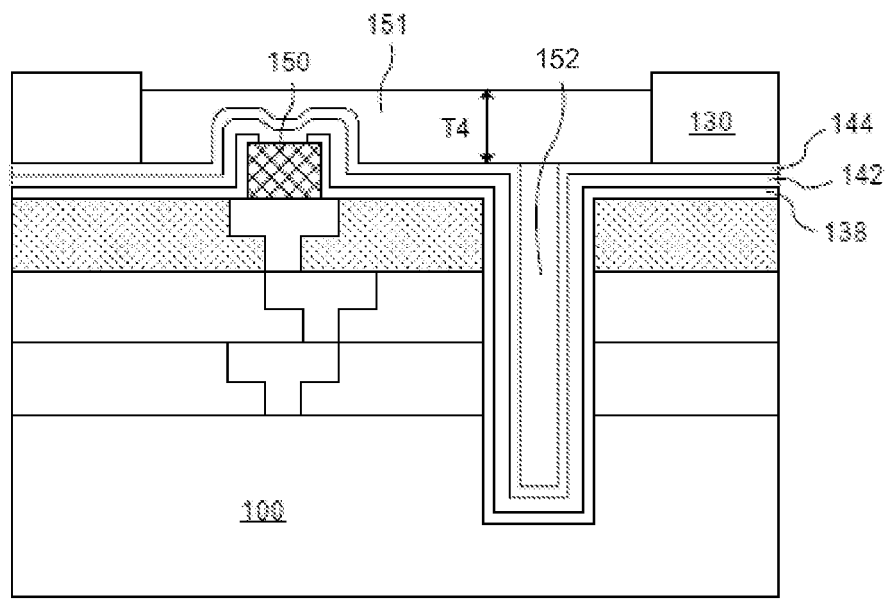
Figure 7G:
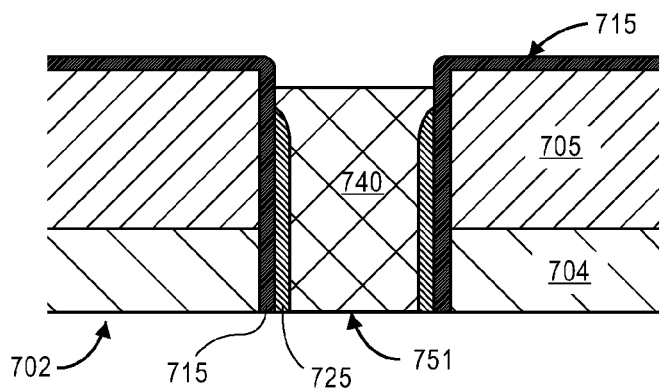

The method 601 then returns to the method 501 (FIG. 1) with selective via fill operation 507A now completed. The method 501 then proceeds with thinning of the substrate at operation 508B with any conventional means known in the art to be applicable for a given substrate. For example, the substrate may be thinned by mechanical grinding and chemical-mechanical polishing (CMP) while the substrate is attached on the opposite side to a carrier or handle. FIG. 7G illustrates a back side 702 thinned from the starting thickness of $T_1$ to a thickness $T_2$, less than $T_1$. As shown, the thinning operation 508B exposes the bottom of the via 710 with each of the dielectric liner 715, catalytic material 725 and fill metal 740 forming a portion of the surface at the back side 702.

Figure 7H:
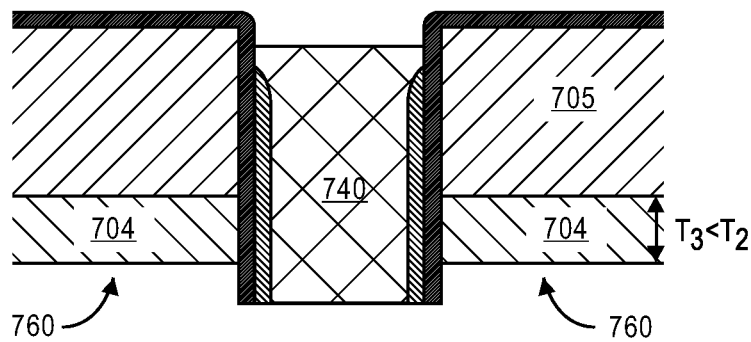
Figure 7I:
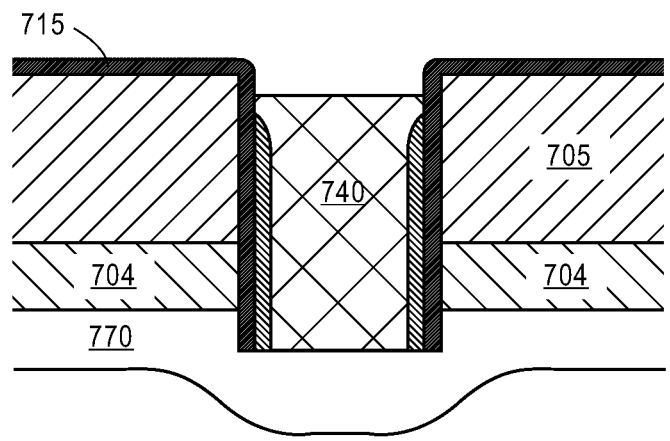
Figure 7J:
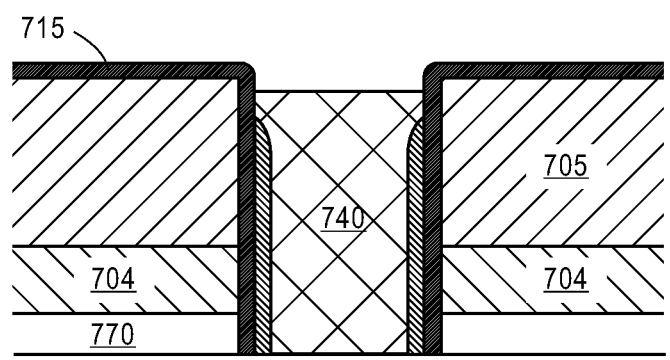
Figure 7K:
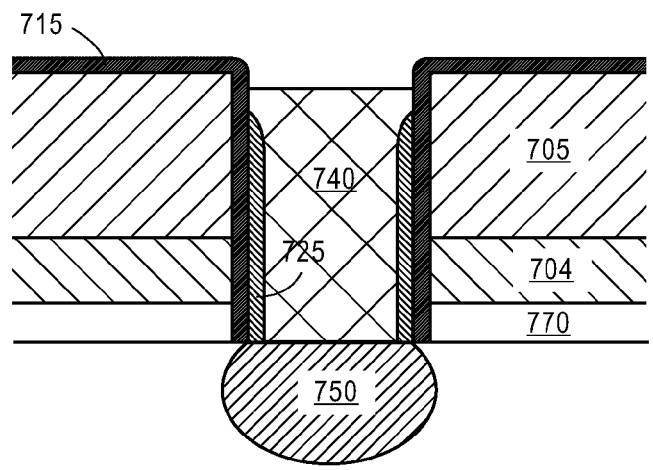

The method 501 then proceeds to operation 530 where (micro) bump metal is plated selectively onto an exposed surface of the via metal. Operation 530 is demarked with a dashed box as being optional. FIGS. 7H-7K illustrate one embodiment of selective bumping of the via metal. As shown in FIG. 7H, the substrate back side is recessed with a substrate etch 760. This recess etch may be with a chemical, vapor, or on etching and is to be selective relative to the via metal (e.g., fill metal 740) to raise the metal-filled via surface relative to the substrate 704. Next, as shown in FIG. 7I, a dielectric layer 770 is deposited over the recessed substrate surface and around the plated via metal. Any of those materials described for the dielectric liner 715 may be utilized for the dielectric layer 770. For example, in one embodiment, CVD is employed to deposit a silicon oxide. As shown in FIG. 7J, the dielectric layer 770 is planarized, for example by CMP to remove the dielectric layer 770 from a surface of at least the fill metal 740. The exposed via metal is then capped through a selective electrochemical deposition to selectively form the micro bump 750. Exemplary electrochemical processes include electroless deposition of Ni, Co, or any the alloys thereof described elsewhere herein in the context of microbumps.

Returning to FIG. 5, also as part of operation 530, one or more redistribution layers may be made at this time with conventional techniques of lithography, clean, underbump metallization, interconnect conductor plating, and etching, etc. Selective deposition of a microbump may then similarly proceed on the top level of the redistribution layers. Operation 540 completes the method 501 for the front side via embodiments with one or more of sort, dicing (i.e., singulation of ICs) and IC packaging. In particular embodiments, the packaging process entails one or more of the 3DIC chip stacking techniques described elsewhere herein. In other embodiments, operation 540 entails any conventional sort, dicing and packaging process.

Figure 9A:
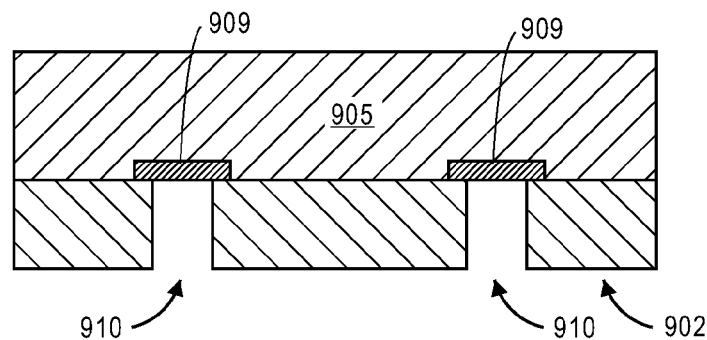
FIGS. 9A, 9B, 9C 9D, and 9E are cross-sectional illustrations of a TSuV at selected operations as the methods of fabricating TSuV structures illustrated in FIGS. 8A, 8B and 8C are performed in accordance with an exemplary embodiment.

Proceeding with further description of back side via implementations of the method 501 in accordance with embodiments, after thinning of the substrate at operation 508A (performed substantially as described elsewhere herein for operation 508B), at operation 506B the via is formed. Any of the via formation techniques described in the context of operation 506A may be employed to form vias from the back side of the substrate. FIG. 9A illustrates in cross-section one embodiment where a substrate 904 having a BEOL stack 905 further includes a front side landing pad 909. Vias are etched from the substrate back side 902, stopping on the landing pad 909.

Figure 8A:
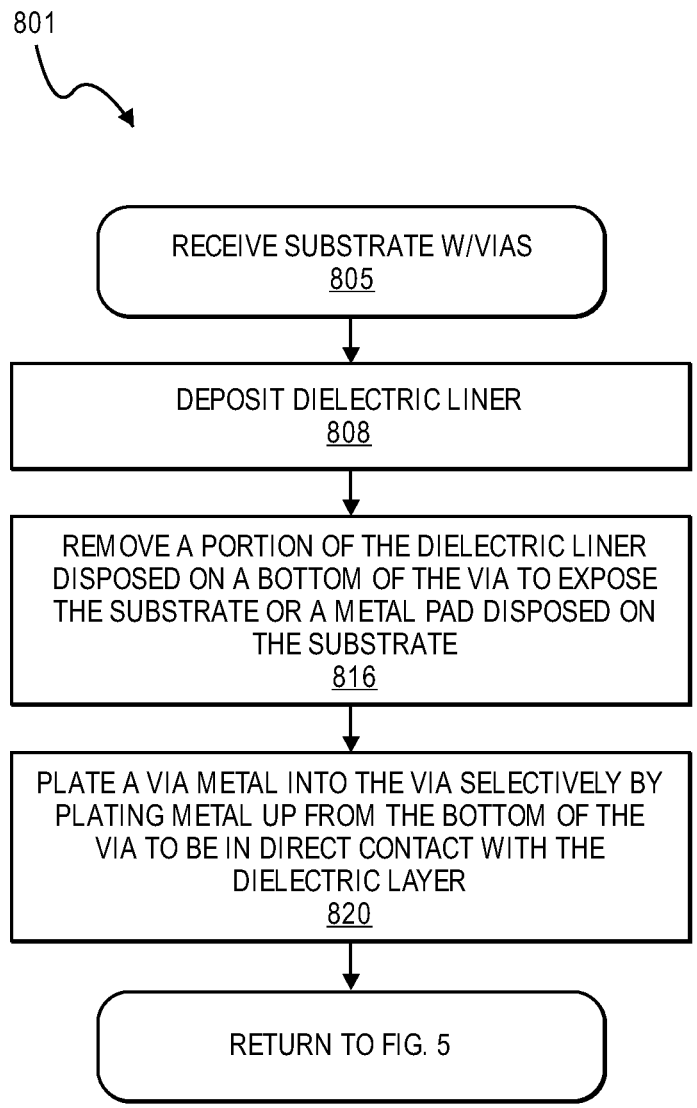
FIGS. 8A, 8B, and 8C are flow diagrams illustrating methods of fabricating TSuV structures illustrated in FIGS. 3A and 3B, in accordance with embodiments of FIG. 5.
Figure 9B:
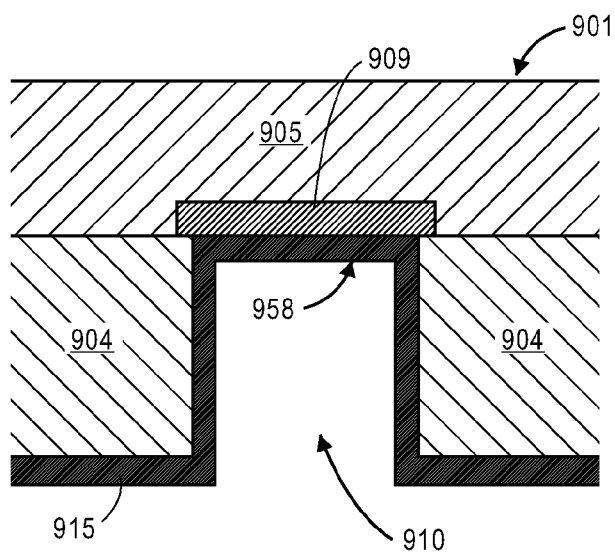

Returning to FIG. 5, with the back side via is formed the method 501 continues to operation 507B where the via is selectively filled. FIG. 8A is a flow diagram illustrating a method 801 that is one embodiment of operation 507B. Upon receipt of the substrate having a back side via at operation 805, a dielectric liner deposited at operation 808. Any of the techniques described elsewhere herein in the context of dielectric liner deposition may be utilized at operation 808 to form any of the dielectric liners described. As further illustrated by FIG. 9B, a dielectric liner 915 is deposited so as to cover the sidewalls of the via 910 and may further be present at the via bottom 958.

Figure 9C:
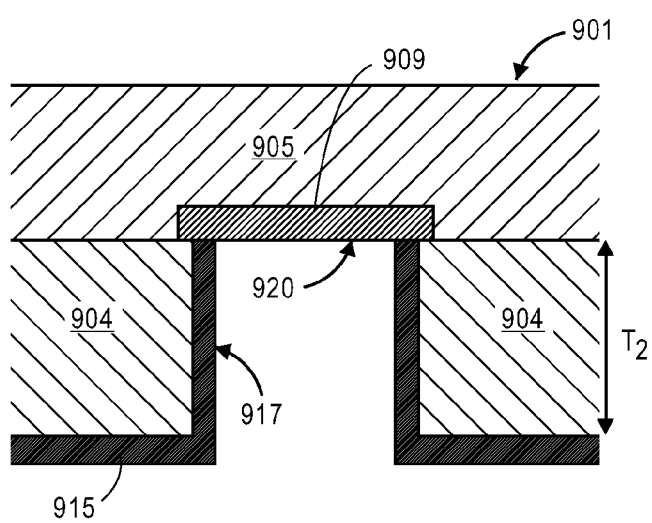

Returning to FIG. 8A, at operation 816 any dielectric liner disposed on a bottom of the via is removed selectively to expose a metal landing pad and or substrate at the bottom of the via. As further illustrated by FIG. 9C, a surface 920 of the landing pad 909 is exposed selectively relative to the via sidewalls 917 so that along the entire substrate thickness $T_2$, the dielectric liner 915 remains. Clearing of the dielectric liner 915 at the bottom of the via is also performed selectively to the substrate back side so that the back side 902 remains protected with some amount of the dielectric liner 915. Exemplary techniques to achieve the selective dielectric removal include, but are not limited to, DRIE whereby ion assisted etching is preferentially accelerated at the via bottom.

In other embodiments, operations 808 and 816 are replaced with a selective deposition of the dielectric liner 915 whereby a dielectric is deposited preferentially onto the substrate relative to the landing pad 909. In one such embodiment for example, a (p-xylylene)-based polymer, such as Parylene X, may be deposited (e.g., by CVD) onto the substrate surfaces selectively over a copper or otherwise metallized surface of the landing pad 909.

Figure 8B:
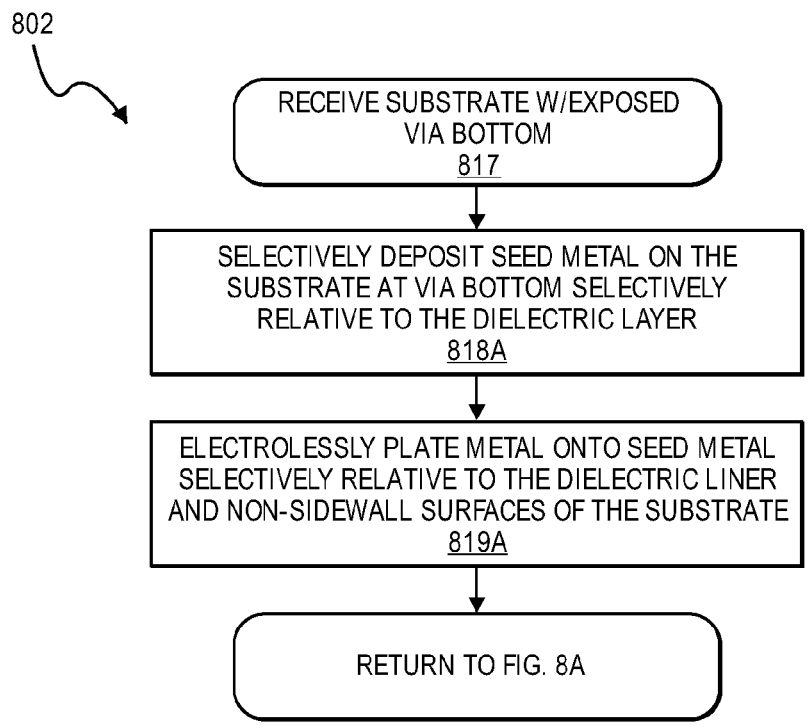
Figure 8C:
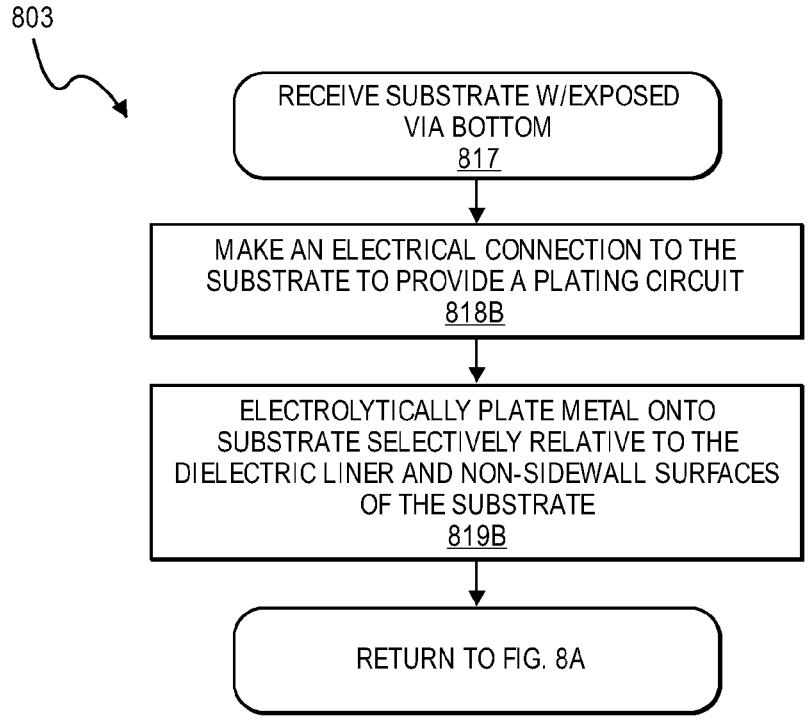
Figure 9D:
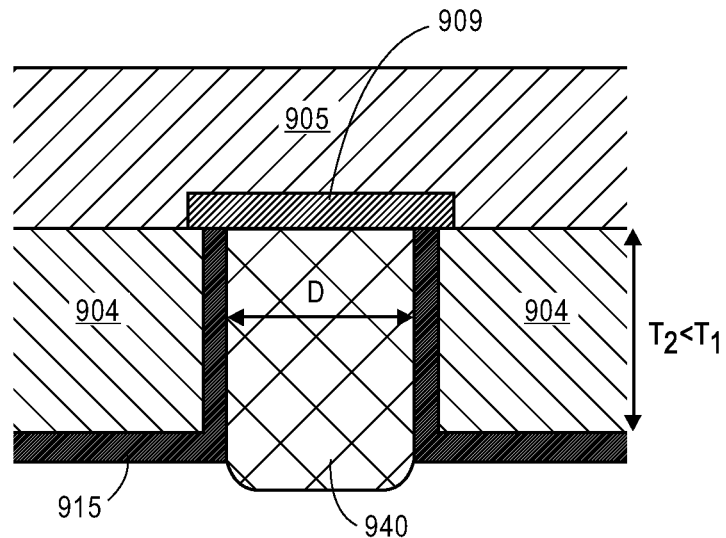

Returning to FIG. 8A, at operation 820 via metal is electrochemically plated selectively by plating the metal up from the exposed bottom of the via to be in direct contact with the dielectric liner. FIGS. 8B and 8C are flow diagrams illustrating embodiments of operation 820. Referring first to FIG. 8B, the method 802 begins with receipt of a substrate with an exposed via bottom at operation 817. A seed metal is deposited at operation 818A onto the exposed via bottom selectively relative to the dielectric liner so that no metal is deposited anywhere except for the bottom of the via. Exemplary embodiments of selective seed metal deposition include electroless deposition and contact displacement. In certain such embodiments, the selective seed layer consists essentially of copper (Cu), or any of the copper alloys described elsewhere herein. Following selective formation of the seed layer, fill metal is plated up from the seed layer at operation 819A selectively so that no metal is plated anywhere except within the via. Any conventional electroless or electrolytic deposition technique may be utilized to plate any of the metal compositions described elsewhere herein. Referring to FIG. 9D, with the seed layer present only at the bottom of the via, plating is such that the microstructure and composition of the fill metal 940 is homogenous across the via diameter (D) right up to the interface with the dielectric liner 915. Furthermore, with plating selective to regions adjacent to the via 910, the via may be readily filled partially to an arbitrary height less than the length of the via (i.e., recessed from the back side 902).

As shown in FIG. 8C, the method 803 begins with receipt of a substrate with an exposed via bottom at operation 817. An electrical connection is then made at operation 818B to connect the substrate into a plating circuit. In one embodiment, the electrical connection couples from a front side of the substrate to a landing pad at the via bottom. Then, at operation 819B, plating of via metal then proceeds selectively relative to the dielectric liner so that no metal is plated on the substrate backside 902. Referring again to FIG. 9D, with the plating electrode only at the bottom of the via, plating is such that the microstructure and composition of the fill metal 940 is homogenous across the via diameter (D) right up to the interface with the dielectric liner 915. Furthermore, with plating selective to regions adjacent to the via 910, the via may be readily filled partially to an arbitrary height less than the length of the via (i.e., recessed from the back side 902).

Figure 5:
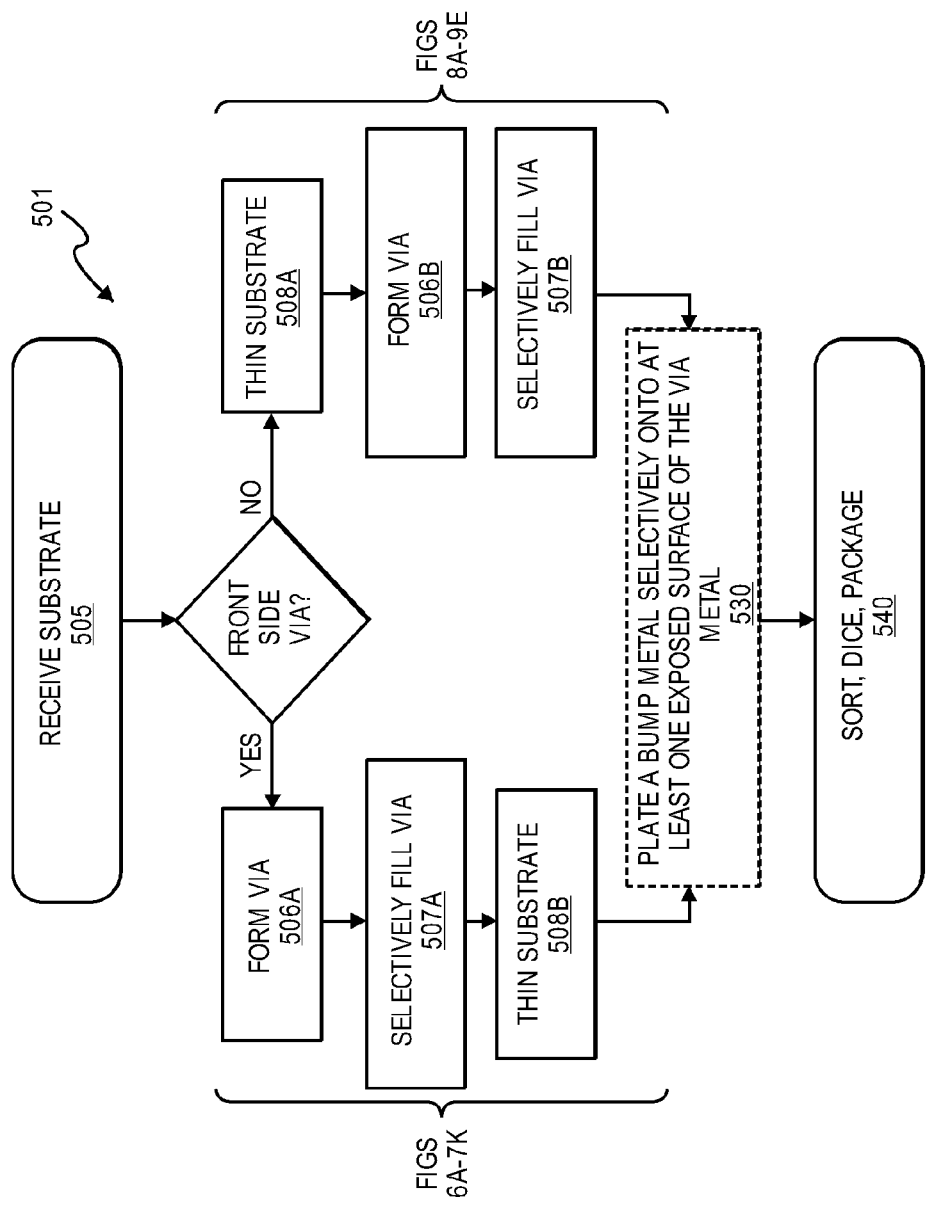
FIG. 5 is a flow diagram illustrating methods of fabricating TSuV structures, in accordance with embodiments.

Notably, the methods 801 and 803 are also applicable within an alternate embodiment where a via etch does not clear the substrate material (e.g. for the front side via etch embodiments of FIG. 5). For such embodiments, an electrical connection is made to the substrate with the substrate serving as the plating electrode and with the dielectric liner having been selectively formed (either selectively deposited or selectively removed) to expose the substrate plating electrode only at the bottom of the via.

Figure 9E:
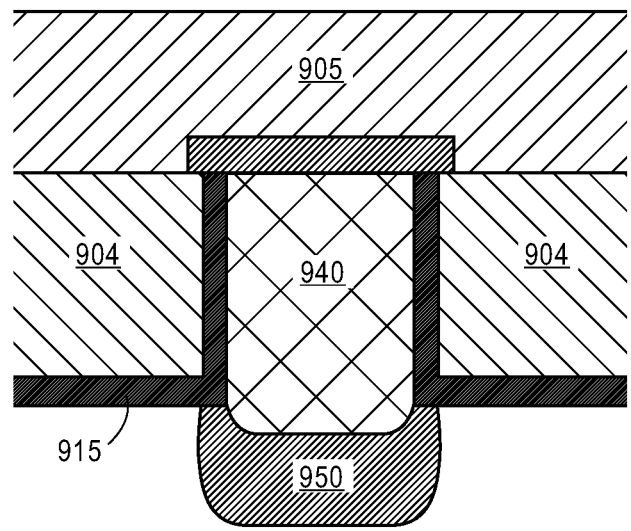

Following selective fill of the vias, methods 802 and 803 then return to the method 801 (FIG. 8A) which returns to method 501 (FIG. 5) for the optional selective bump plating operation 530. As shown in FIG. 9E, for a back side via implementation, selective bump formation may simply proceed with selective deposition of any of the microbump materials described herein (e.g., Ni, Co, or alloys) as the dielectric liner 915 remains covering the substrate back side 902 following the selective via fill operation 507B.

Figure 10:
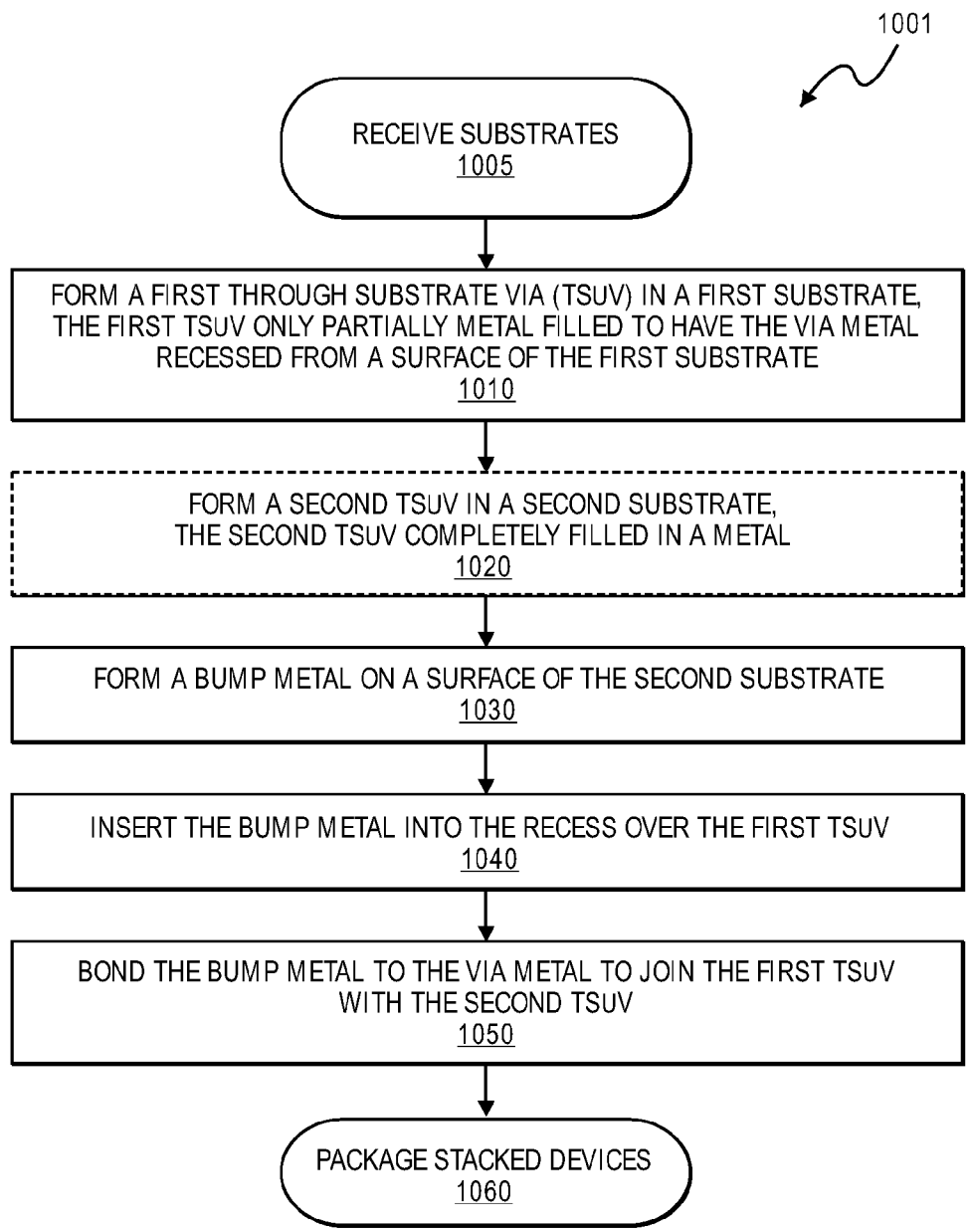
FIG. 10 is a flow diagram illustrating a method of assembling stack chips illustrated in FIGS. 4A, 4B, and 4C, in accordance with embodiments.
Figure 11:
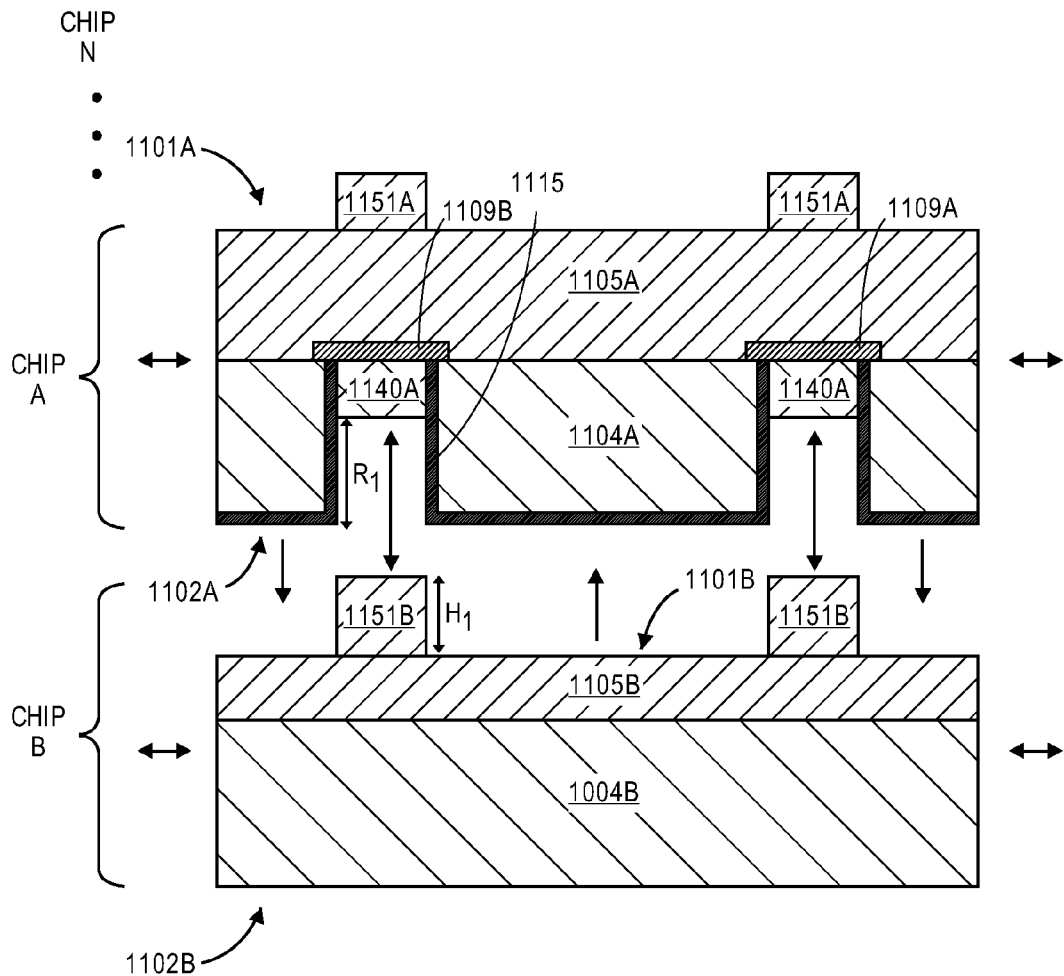
FIG. 11 is a cross-sectional illustration of chip stacking at a selected operation as the method illustrated in FIG. 10 is performed in accordance with an exemplary embodiment.

FIG. 10 is a flow diagram illustrating a method 1001 for fabricating an electronic device assembly including a plurality of chips stacked as illustrated in FIGS. 4A, 4B, and 4C, in accordance with embodiments. FIG. 11 is a cross-sectional illustration of chip stacking at a selected operation as the method 1001 is performed in accordance with an exemplary embodiment.

The method 1001 begins at operation 1005 with receipt of at least two substrates. Where at least one of these substrates does not already include a TSuV, at operation 1010 a first TSuV structure having the structural features described elsewhere herein is formed following at least one of the fabrication techniques described. In one embodiment where both of the at least two substrates are to be part of a larger chip assembly, the second substrate is similarly processed to form a second TSuV structure having the structural features described elsewhere herein is formed following at least one of the fabrication techniques described. At operation 1030 a substrate is further processed to include a microbump, for example any of the selective microbump plating techniques described herein may be performed.

In the exemplary multi-chip stacking embodiment further illustrated in FIG. 11, following operation 1030, a first chip (A) includes a partially filled via in a back side 1102A of the substrate 1104A while a second chip (B) includes a microbump 1151B extending from a front side 1101B of the substrate 1004B with a BEOL stack 1105B there between.

Returning to FIG. 10, at operation 1040, the bump metal is inserted into the recess over the partially filled TSuV. As further illustrated in FIG. 11, a convention horizontal and rotational alignment is performed (chip level or wafer level), and the chips A and B brought together to have the bump 1151B in contact with the fill metal 1140A. At operation 1050 (FIG. 10), thermal compression bonding is performed using techniques and parameters known in the art for the particular metals present in each of the bump 1151B and fill metal 1140A (e.g., Cu—Cu bonding, eutectic Cu—Sn, Au—Sn, or In—Au, etc.) to arrive at any of the assemblies described in the context of FIGS. 4A-4C. Method 1001 then completes with underfill between the stack chips and packaging of the stacked-chip assembly using any conventional packaging technique.

The above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A microelectronic device, comprising:
    a substrate including a first surface and a second surface;
    a through substrate via (TSuV) extending through the substrate between the first surface and the second surface;
    a dielectric liner in contact with the substrate;
    a catalytic material in contact with the dielectric liner at an inside sidewall surface of the TSuV, the inside sidewall surface extending from the first surface to the second surface, wherein the catalytic material extends along the inside sidewall surface only partially between the first surface and the second surface; and
    a metal disposed within the TSuV, wherein the metal is in direct contact with the catalytic material.

2. The microelectronic device of claim 1, wherein the catalytic material is a metal film or a layer of metal particles comprising at least one of: palladium (Pd), silver (Ag), gold (Au), iridium (Ir), osmium (Os), platinum (Pt), rhodium (Rh), ruthenium (Ru), nickel (Ni), cobalt (Co), iron (Fe), tin (Sn), bismuth (Bi), cadmium (Cd), titanium (Ti), tantalum (Ta), vanadium (V), tungsten (W), aluminum (Al), or copper (Cu).

3. The microelectronic device of claim 1, wherein the catalytic material is a photosensitive film comprising at least one of: titanium oxide ($TiO_2$), tin oxide ($SnO_2$), zinc oxide (ZnO), and lead iodide ($PbI_2$), and wherein the photosensitive film has catalytic particles comprising at least one of: palladium (Pd), platinum (Pt), silver (Ag), gold (Au), nickel (Ni), cobalt (Co), or copper (Cu).

4. The microelectronic device of claim 1, wherein the dielectric liner comprises at least one of: silicon dioxide ($SiO_2$), aluminum oxide ($Al_2O_3$), tantalum oxide ($Ta_2O_5$), silicon nitride ($Si_xN_y$), silicon carbide (SiC), silicon oxy-carbo-nitride (SiOCN), a benzocyclobutene (BCB)-based polymer, or a (p-xylylene)-based polymer.

5. The microelectronic device of claim 4, wherein the dielectric liner has the catalytic material on the liner surface and wherein the metal is in direct contact with the dielectric liner.

6. The microelectronic device of claim 5, wherein the dielectric liner comprises at least one of silicon nitride, silicon carbide, silicon oxy-carbo-nitride, or a (p-xylylene)-based polymer.

7. The microelectronic device of claim 1, wherein the metal comprises Cu and at least 1 PPM of at least one of: hydrogen (H), chlorine (Cl), oxygen (O), sulfur (S), carbon (C), or nitrogen (N).

8. The microelectronic device of claim 1, wherein the metal further comprises a diffusion barrier layer disposed over the dielectric liner, the diffusion barrier layer comprising at least one of nickel (Ni) or cobalt (Co) alloyed with at least one of: boron (B), phosphorus (P), nitrogen (N), tungsten (W), molybdenum (Mo), or rhenium (Re).

9. The microelectronic device of claim 1, wherein the TSuV extends between a bump disposed over a dielectric layer disposed over a front side of the substrate to a second bump disposed over a back side of the substrate.

10. The microelectronic device of claim 1, wherein the substrate has bumps on both a front side and a back side, and wherein the device further comprises a front side metal pad disposed over a front side of the substrate with a dielectric layer disposed between the front side bump and the front side metal pad, and wherein the TSuV extends between the front side metal pad and a back side bump.

11. The microelectronic device of claim 1, wherein the substrate has bumps on both a front side and a back side, and wherein the device further comprises a front side metal pad disposed over a front side of the substrate with at least one interconnect layer disposed between the front side bump and front side metal pad, and wherein the device further comprises a backside redistribution layer having at least one metal layer, and wherein the TSuV extends between the front side pad and metal of the redistribution layer.

12. A microelectronic device assembly comprising:
a first of the microelectronic device in claim 1, wherein at least one first metal bump is disposed on a surface of a first TSuV; and
a second of the microelectronic device in claim 1, wherein at least one second metal bump is disposed on a surface of a second TSuV, and wherein the first and second TSuVs are stacked together with the first and second metal bumps bonded together.

13. A microelectronic device assembly comprising:
a first of the microelectronic device in claim 1 comprising a first TSuV; and
a second of the microelectronic device in claim 1 comprising a second TSuV, wherein a first metal bump is disposed on a surface of the first TSuV, and wherein the first and second TSuVs are stacked together with the first metal bump bonded directly to the second TSuV.

14. The microelectronic device assembly of claim 13, wherein the second TSuV is partially filled, with the via metal recessed from a surface of the substrate and the first metal bump disposed in the recess.

15. The microelectronic device assembly of claim 14, wherein the via metal partially filling the second TSuV comprises a surface finish metal distinct from the metal of the first metal bump.

* * * * *